United States Patent
Kimura et al.

(10) Patent No.: US 10,205,277 B2
(45) Date of Patent: Feb. 12, 2019

(54) CARD-TYPE STORAGE DEVICE HAVING HEAT DISSIPATION STRUCTURE AND SLOT DEVICE

(71) Applicant: CANON KABUSHIKI KAISHA, Tokyo (JP)

(72) Inventors: Masafumi Kimura, Kawasaki (JP); Fumihiro Kajimura, Kawasaki (JP); Go Naito, Kawasaki (JP); Kyosuke Sato, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/483,235

(22) Filed: Apr. 10, 2017

(65) Prior Publication Data
US 2017/0302023 A1    Oct. 19, 2017

(30) Foreign Application Priority Data
Apr. 14, 2016    (JP) .................................. 2016-081055

(51) Int. Cl.
| | |
|---|---|
| *H01R 13/631* | (2006.01) |
| *H05K 5/02* | (2006.01) |
| *H05K 7/20* | (2006.01) |
| *G06K 13/02* | (2006.01) |

(52) U.S. Cl.
CPC .......... *H01R 13/631* (2013.01); *G06K 13/02* (2013.01); *H05K 5/0286* (2013.01); *H05K 7/2039* (2013.01)

(58) Field of Classification Search
CPC ................ H01R 13/631; H01R 12/721; H01R 12/7005; H01R 13/64; H05K 5/0286; H05K 7/2039; H05K 7/20154
USPC .......................... 439/377, 485, 487, 374, 630
See application file for complete search history.

(56) References Cited

U.S. PATENT DOCUMENTS

| | | | | |
|---|---|---|---|---|
| 4,314,311 | A * | 2/1982 | Seytre ............... | H01R 23/7005 361/704 |
| 4,797,786 | A * | 1/1989 | Belanger, Jr. ....... | H05K 7/1053 211/41.17 |
| 7,267,561 | B2 * | 9/2007 | Lai ........................ | H01R 13/64 439/138 |
| 7,340,540 | B2 * | 3/2008 | Miller .................. | G06K 19/077 235/493 |

(Continued)

FOREIGN PATENT DOCUMENTS

| | | |
|---|---|---|
| JP | 2000-283620 A | 10/2000 |
| JP | 2011-95961 A | 5/2011 |

*Primary Examiner* — Tulsidas C Patel
*Assistant Examiner* — Travis Chambers
(74) *Attorney, Agent, or Firm* — Carter, DeLuca, Farrell & Schmidt, LLP

(57) ABSTRACT

A card-type storage device and a slot device, which are capable of preventing lowering of the reliability due to repeated insertion and removal of the storage device. A card medium includes card thermal contacts each having a contact surface which intersects with a thickness direction of the card medium. A first card upper guide surface restricts the position of the card medium in the thickness direction to a first position. An escape portion restricts the position of the card medium in the thickness direction to a different position from the first position. A second card upper guide surface links the first card upper guide surface and the escape portion.

12 Claims, 12 Drawing Sheets

(56) References Cited

U.S. PATENT DOCUMENTS

| | | | | |
|---|---|---|---|---|
| 7,686,652 B2* | 3/2010 | Yu | ............... | H01R 12/714 |
| | | | | 439/159 |
| 7,703,692 B2* | 4/2010 | Aoki | ............... | G06K 19/07732 |
| | | | | 235/380 |
| 7,768,785 B2* | 8/2010 | Ni | ............... | H01L 23/367 |
| | | | | 257/707 |
| 7,819,679 B2* | 10/2010 | Tsujimoto | ............... | H05K 5/0295 |
| | | | | 439/159 |
| 8,167,659 B2* | 5/2012 | Miller | ............... | H01R 27/00 |
| | | | | 439/235 |
| 8,172,619 B2* | 5/2012 | Williams | ............... | G06K 7/0021 |
| | | | | 439/630 |
| 9,048,557 B2* | 6/2015 | Kang | ............... | G06K 19/07732 |
| 9,390,299 B1* | 7/2016 | Beals | ............... | H01R 12/714 |
| 2003/0124890 A1* | 7/2003 | Harasawa | ............... | G06K 13/08 |
| | | | | 439/159 |
| 2006/0056154 A1* | 3/2006 | Foster, Sr. | ............... | G06F 1/185 |
| | | | | 361/700 |
| 2006/0281361 A1* | 12/2006 | Uchida | ............... | H01R 12/79 |
| | | | | 439/492 |
| 2007/0134987 A1* | 6/2007 | Yen | ............... | H01R 13/7032 |
| | | | | 439/630 |
| 2010/0321004 A1* | 12/2010 | Lauks | ............... | B01L 3/502707 |
| | | | | 324/156 |

\* cited by examiner

CARD-TYPE STORAGE DEVICE HAVING HEAT DISSIPATION STRUCTURE AND SLOT DEVICE

BACKGROUND OF THE INVENTION

Field of the Invention

The present invention relates to a card-type storage device, such as a memory card, and a slot device into which the card-type storage device is inserted, and more particularly to a structure for dissipating heat from the card-type storage device.

Description of the Related Art

A card-type storage device (hereinafter referred to as the card medium), such as a memory card, is widely used as a medium for recording information (such as data) in electronic apparatuses, such as portable devices. In recent years, there has been known such a card medium which is configured to read and write information at high speed. Particularly, in a case where a digital camera as one of the electronic apparatuses performs moving image shooting, as image definition is made higher, the transfer rate of image data has to be increased, that is, it is necessary to perform writing of image data at high-speed.

In general, as the transfer rate of data becomes higher, power consumption in a card medium becomes larger, which increases heat generation. Therefore, heat transfer via electrical contacts and natural convection are not effective enough to exhaust heat from the card medium, which sometimes prevents the apparatus from normally operating due to increased temperature.

On the other hand, there has been proposed a device in which a heat conductive material is provided in a card medium so as to effectively exhaust heat from the card medium (see Japanese Laid-Open Patent Publication (Kokai) No. 2011-95961). In Japanese Laid-Open Patent Publication (Kokai) No. 2011-95961, part of a card case or a slot device (referred to as the card slot), into which a card medium is inserted, is brought into contact with a heat dissipation path extending from the heat conductive material to thereby promote heat dissipation.

Further, there has been proposed a heat transfer connector configured to connect a device having a heat generation source and a device as a heat dissipation destination by a cylindrical protrusion made of metallic material, and arrange a tubular contact, which is elastic and has heat conductive fluid sealed therein, in at least one of the devices (Japanese Laid-Open Patent Publication (Kokai) No. 2000-283620).

However, according to Japanese Laid-Open Patent Publication (Kokai) No. 2011-95961, the card medium and the card slot are connected via a contact. Therefore, although the reliability is ensured provided that the contact has a spring property, the card medium and the card slot are brought into linear contact with each other, which reduces thermal conductivity. On the other hand, if the contact has no spring property, although thermal conductivity is improved, when the card medium is repeatedly inserted and removed, contact between the card medium and the card slot becomes unstable, which lowers the reliability.

In Japanese Laid-Open Patent Publication (Kokai) No. 2000-283620, although thermal conductivity is improved by surface contact, since the tubular contact having the heat conductive fluid sealed therein is used, the disclosed mechanism of the heat conductive connector is low in reliability for the card medium which is repeatedly inserted and removed.

SUMMARY OF THE INVENTION

The present invention provides a card-type storage device and a slot device, which are capable of preventing lowering of the reliability due to repeated insertion and removal of the card-type storage device, and thereby improving thermal and electrical connection therebetween.

In a first aspect of the present invention, there is provided a card-type storage device comprising a first thermal contact having a contact surface which intersects with a thickness direction of the card-type storage device, a first restriction portion that restricts a position of the card-type storage device in the thickness direction to a predetermined first position, a second restriction portion that restricts the position of the card-type storage device in the thickness direction to a predetermined second position which is different from the predetermined first position, and a third restriction portion that links the first restriction portion and the second restriction portion.

In a second aspect of the present invention, there is provided a slot device into which and from which a card-type storage device is inserted and removed, wherein the card-type storage device includes a first thermal contact having a contact surface which intersects with a thickness direction of the card-type storage device, a first restriction portion that restricts a position of the card-type storage device in the thickness direction to a predetermined first position, a second restriction portion that restricts the position of the card-type storage device in the thickness direction to a predetermined second position which is different from the predetermined first position, and a third restriction portion that links the first restriction portion and the second restriction portion, the slot device comprising an urging portion that urges, when the card-type storage device is inserted, the card-type storage device in the thickness direction, a second thermal contact that has a contact surface intersecting with the thickness direction of the card-type storage device, and is brought into contact with the first thermal contact, a first guide portion that cooperates with the first restriction portion to restrict the position of the card-type storage device in the thickness direction to the predetermined first position, a second guide portion that cooperates with the first restriction portion to restrict the position of the card-type storage device in the thickness direction to the predetermined second position, and a third guide portion that links the first guide portion and the second guide portion.

According to the present invention, it is possible to prevent lowering of the reliability due to repeated insertion and removal of a card-type storage device, and thereby improve thermal and electrical connection.

Further features of the present invention will become apparent from the following description of exemplary embodiments (with reference to the attached drawings).

DESCRIPTION OF THE EMBODIMENTS

The present invention will now be described in detail below with reference to the accompanying drawings showing embodiments thereof. The following description will be given of an example of a card-type storage device and a slot device into which and from which the card-type storage device is inserted and removed, according to embodiments of the present invention.

Figure 1:
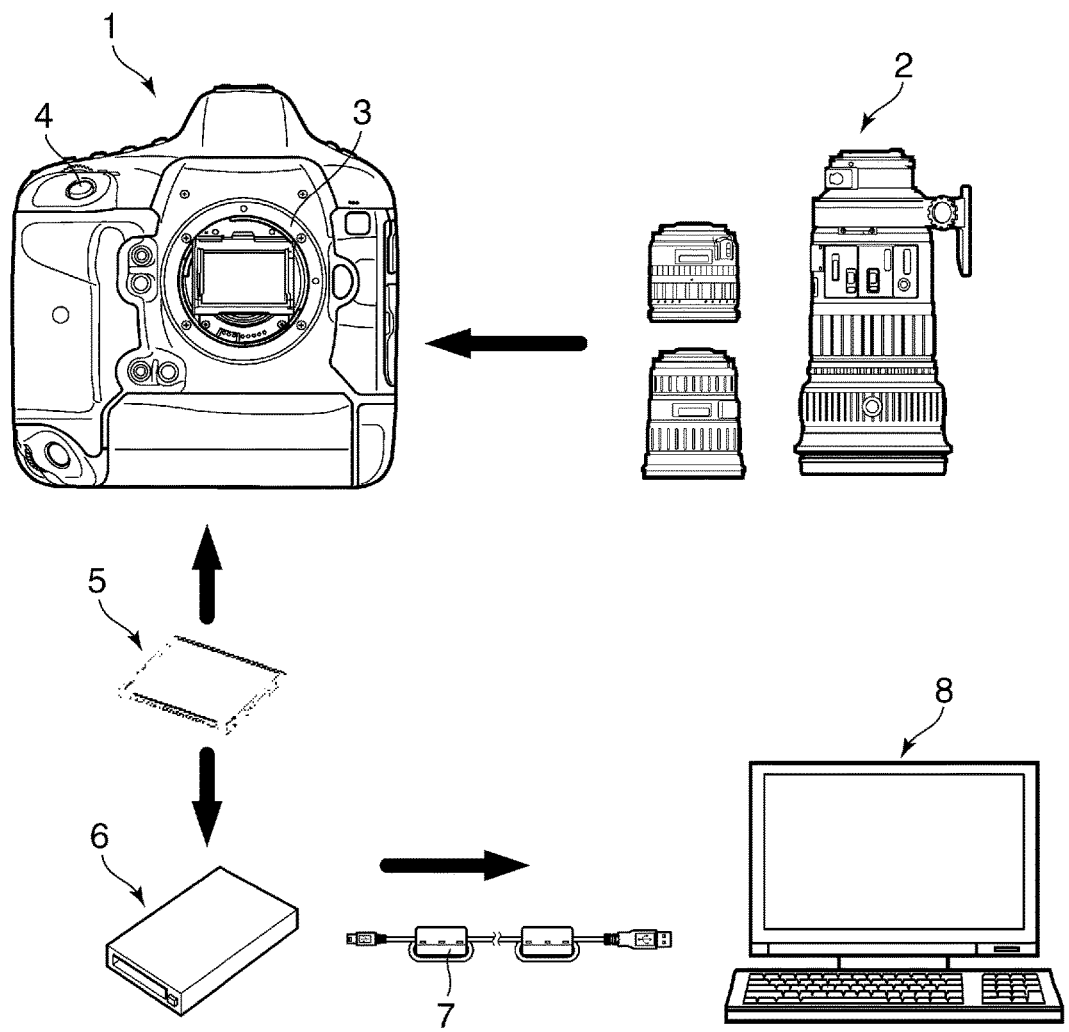
FIG. 1 is a diagram showing an example of an electronic apparatus in which a card-type storage device (card medium) according to a first embodiment of the present invention is used.

FIG. 1 is a diagram showing an example of an electronic apparatus in which a card-type storage device according to a first embodiment of the present invention is used.

The illustrated electronic apparatus is an image pickup apparatus, such as a digital camera (hereinafter simply referred to as the camera), and the illustrated camera includes a camera body 1 in which one of a plurality of lens units 2 is selectively mounted via an interface 3 provided on the camera body 1. The camera body 1 is provided with an operation section 4 (one of components thereof is indicated by reference numeral 4 in FIG. 1) for operating the camera. For example, a user performs operations for shooting and recording a moving image via the operation section 4. A card-type storage device (hereinafter referred to as the card medium) 5 for recording e.g. image data is mounted in the camera body 1. The card medium 5 is inserted into and removed from a slot device (hereinafter simply referred to as the slot) 31, described hereinafter, which is provided in the camera body 1, as needed.

For example, when editing image data (such as a moving image file) recorded in the card medium 5, the user removes the card medium 5 from the camera body 1, and inserts the same into a card reader 6. Note that the card reader 6 is also provided with a slot for inserting the card medium 5. The card reader 6 is connected to a personal computer (PC) 8 via a cable 7, and the user causes the PC 8 to read the image data from the card medium 5, and edits the image data.

As described above, the card medium 5 is inserted into or removed from the camera body 1 or the card reader 6 as needed. Note that in the present example, the card medium 5 refers to a medium formed into a thin flat shape for the purpose of portability and findability (easiness in attaching a label or the like thereto).

Figure 2A:
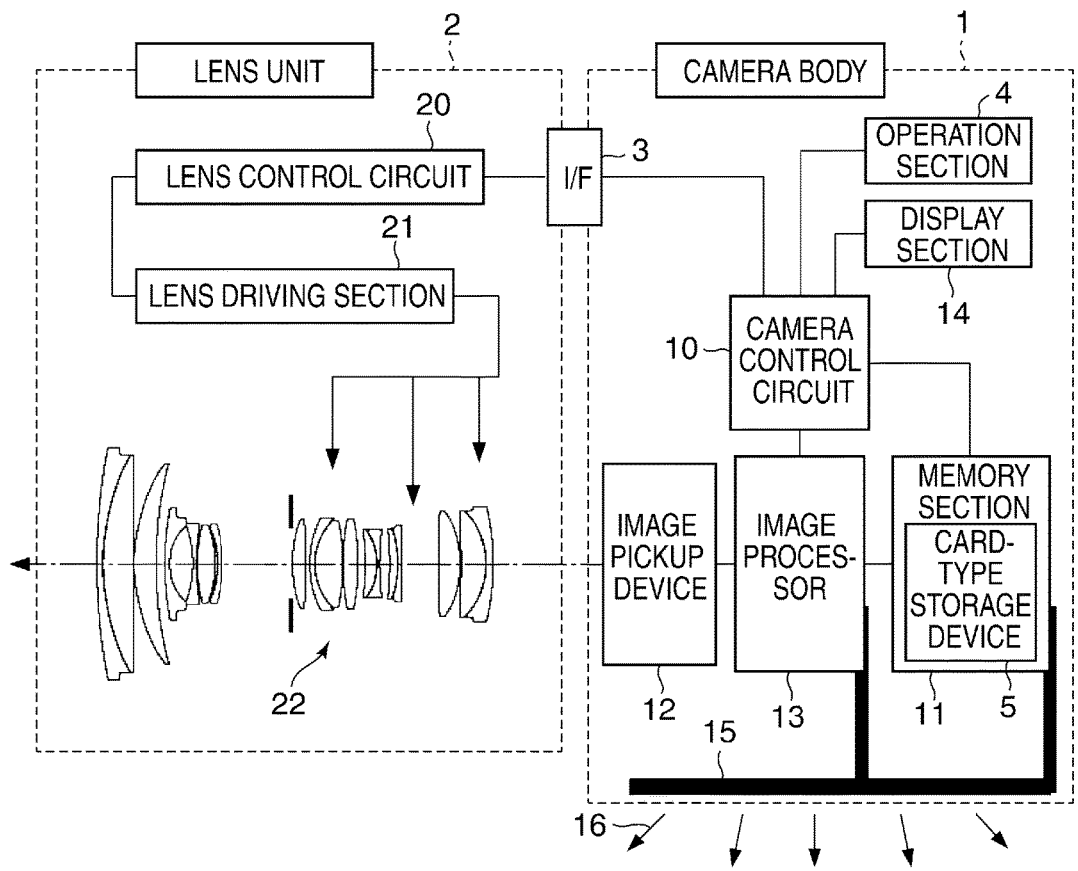
FIGS. 2A and 2B are block diagrams of examples of configurations of the camera and the card medium shown in FIG. 1, respectively.
Figure 2B:
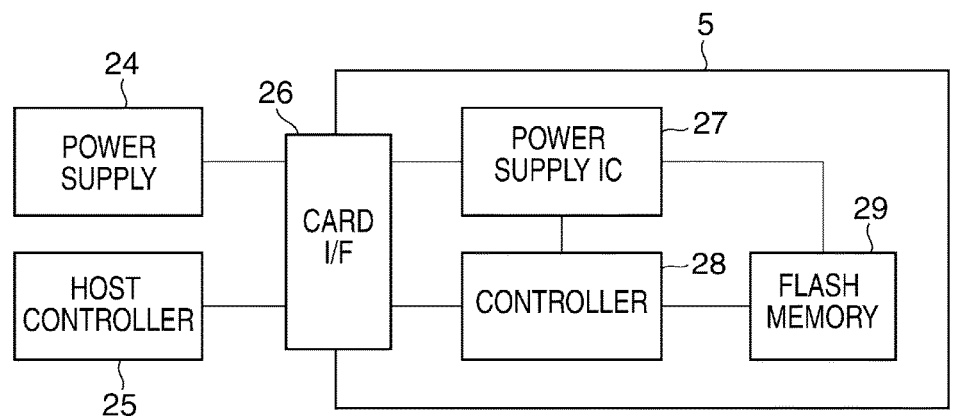

FIGS. 2A and 2B are block diagrams of examples of configurations of the camera and the card medium shown in FIG. 1, respectively. FIG. 2A is a block diagram of the camera, while FIG. 2B is a block diagram of the card medium. Note that the same components in FIGS. 2A and 2B as those in FIG. 1 are denoted by the same reference numerals.

First, referring to FIG. 2A, the camera body 1 includes a camera system control circuit (hereinafter referred to as the camera control circuit) 10, and the camera control circuit 10 controls the overall operation of the camera. The operation section 4 includes a release button, and so forth, and the camera control circuit 10 performs image pickup control according to an operation of the release button. An optical image is formed on an image pickup device 12 via a photographic optical system 22 provided in the lens unit (hereinafter simply referred to as the lens) 2. Then, the image pickup device 12 outputs image signals corresponding to the optical image.

A lens system control circuit (hereinafter referred to as the lens control circuit) 20 controls driving of a lens driving section 21 to adjust the photographic optical system 22, under the control of the camera control circuit 10. For example, the lens control circuit 20 controls driving of the photographic optical system 22 such that an image forming plane where an image is formed by the photographic optical system 22 is brought to a position of the image pickup device 12 (so-called focusing). Further, the lens control circuit 20 controls an aperture based on the level of the image signals. Further, the camera control circuit 20 adjusts brightness by controlling charge accumulation in the image pickup device 12 based on the level of the image signals (so-called exposure control).

Image signals as an output from the image pickup device 12 are sent to an image processor 13. The image processor 13 includes an analog-to-digital converter, a white balance adjustment circuit, a gamma correction circuit, an interpolation calculation circuit, and so forth, none of which are particularly shown. The image processor 13 performs predetermined image processing on the image signals to thereby generate image data under the control of the camera control circuit 10. Then, the camera control circuit 10 displays an image corresponding to the generated image data on a display section 14. Further, the image processor 13 compresses e.g. image data by a predetermined method, and records the compressed image data in a memory section 11. Note that when moving image shooting is performed as mentioned above, a moving image file is recorded in the memory section 11.

The memory section 11 is provided with a storage section and the slot 31. The card-type storage device (card medium) 5 is inserted into the slot 31. The image processor 13 records e.g. a moving image file in the card medium 5 under the control of the camera control circuit 10.

When an operation of a release button as the one of the components of the operation section 4 is detected, the camera control circuit 10 drives the image pickup device 12, and causes the image processor 13 to operate, to thereby control compression processing and so forth. Further, the camera control circuit 10 displays information indicative of a state of the camera and the like on the display section 14.

The camera control circuit 10 determines a focus position and a diaphragm position of the photographic optical system 22 based on the image data generated according to the image signals as an output from the image pickup device 12. Then, the camera control circuit 10 controls the lens control circuit 20 via the interface (I/F) 3 to control driving of the lens driving section 21. Thus, focusing and exposure control are performed.

As shown in FIG. 2A, a heat transfer section 15 provided on the camera body 1 is thermally connected to the image processor 13 and the memory section 11. The heat transfer section 15 is formed e.g. by a heat pipe or a graphite sheet. The heat transfer section 15 thermally connects the image processor 13 and the memory section 11, which are representative heat sources in the camera body 1, to heat dissipation part (an exterior and the like of the camera body 1). As a result, heat is dissipated from the camera body 1 to the outside by natural convection and radiation via the heat transfer section 15 as indicated by arrows 16 in FIG. 2A.

Next, referring to FIG. 2B, the card medium 5 includes a power supply IC 27, a card controller IC (also referred to as the controller) 28, and a flash memory 29. The card medium 5 is connected to a power supply 24 and a host controller 25 via a card interface (I/F) 26. Note that the power supply 24 appearing in FIG. 2B is a power supply provided in the camera body 1, and the host controller 25 is the camera control circuit 10 appearing in FIG. 2A. Further, although FIG. 2B shows one flash memory 29, the plurality of flash memories 29 may be provided.

The specifications of the physical structure of the card interface 26, signal lines, and so forth, are defined as standards of the card medium 5 in advance. The card interface 26 is provided with power supply contacts for power supply, signal contacts for information transmission, and thermal contacts for heat transfer, described hereinafter. The power supply contacts connect between the power supply 24 and the power supply IC 27, and the signal contacts connect between the host controller 25 and the controller 28.

The power supply IC 27 controls the voltage of the power supply 24 to a voltage level required by the controller 28 and the flash memory 29. The controller 28 performs error correction, block management, wear leveling, and so forth. Further, the controller 28 includes interfaces, not shown, for the host controller 25 and the flash memory 29. With this, the controller 28 records data sent from the host controller 25 in the flash memory 29, and further, sends the data recorded in the flash memory 29 to the host controller 25.

After the card medium 5 is connected to the memory section 11 (i.e. inserted into the slot 31), the host controller 25 is capable of recording a moving image file in the card medium 5 via the memory section 11. Further, the host controller 25 is capable of reading a moving image file from the card medium 5 to reproduce and display the moving image file on the display section 14.

Figure 3A:
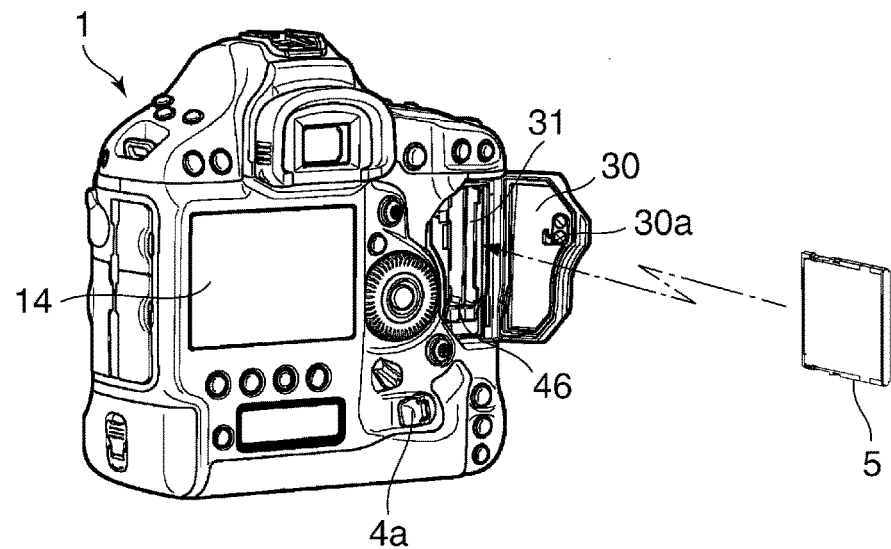
FIGS. 3A and 3B are diagrams useful in explaining insertion of the card medium shown in FIG. 2B into a memory section appearing in FIG. 2A.
Figure 3B:
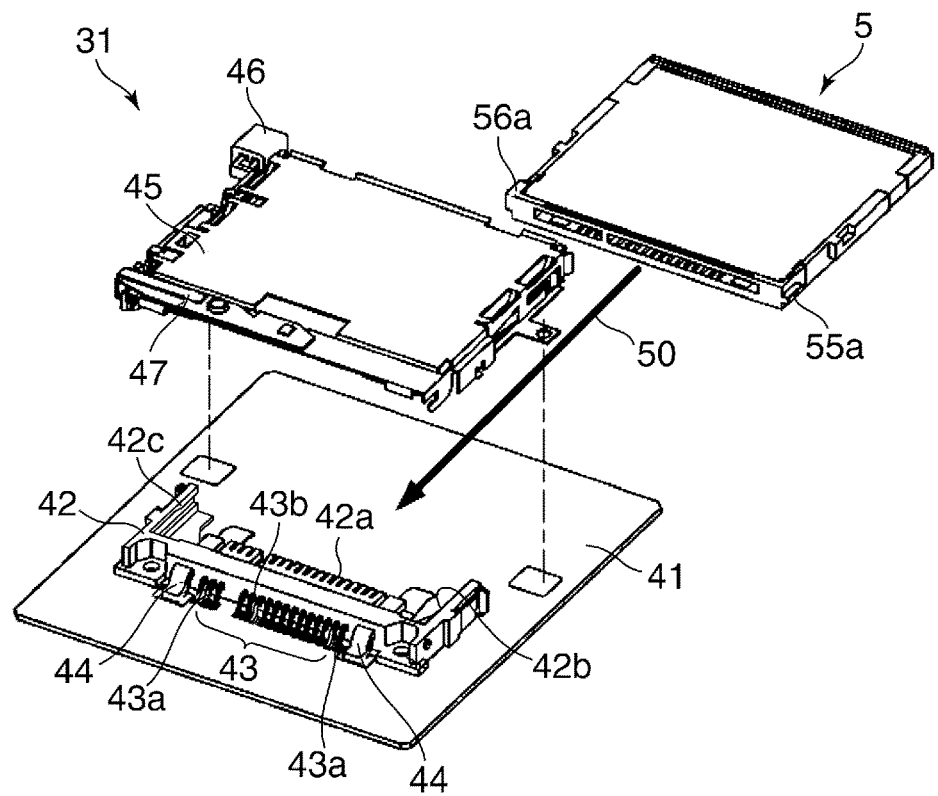

FIGS. 3A and 3B are diagrams useful in explaining insertion of the card medium 5 shown in FIG. 2B into the memory section 11 appearing in FIG. 2A. FIG. 3A is a diagram showing a relationship between the camera and the card medium 5, and FIG. 3B is a perspective view of the slot 31 provided in the memory section 11 appearing in FIG. 2A in an exploded state.

First, referring to FIG. 3A, the operation section 4 is provided with a cover operation switch 4a for opening a slot door 30. When inserting the card medium 5 into the camera body 1, the user operates the cover operation switch 4a. By this operation, a hook 30a provided on the slot door 30 is disengaged, whereby the slot door 30 is opened to expose the slot 31. Then, the user inserts the card medium 5 into the slot 31.

The slot 31 is provided with an eject mechanism, and when the card medium 5 is inserted, an eject button 46 protrudes outside the camera body 1. Note that in the illustrated example, the two card media 5 of the same type or different types can be inserted in parallel. That is, the slot 31 is provided as two slots 31 arranged side by side.

When the slot door 30 is closed after the card medium 5 has been inserted into the slot 31, the camera control circuit 10 and the card medium 5 are capable of communicating with each other. The camera body 1 is provided with a detection switch, not shown, for detecting opening and closing of the slot door 30. When closing of the slot door 30 is detected, the camera control circuit 10 checks whether or not the card medium 5 is present, and if the card medium 5 is present, the camera control circuit 10 becomes capable of communicating with the card medium 5. On the other hand, when opening of the slot door 30 is detected, the camera control circuit 10 performs processing for immediately terminating recording of image data, and so forth.

To remove the card medium 5 from the slot 31, the user operates the operation switch 4a. This operation causes the hook 30a provided on the slot door 30 to be disengaged, whereby the slot door 30 is opened. After that, when the user pushes in the eject button 46, the card medium 5 is pushed out to a position where the user can easily pinch the card medium 5. By holding an end portion of the card medium 5 and pulling the card medium 5 toward the near side, the user can remove the card medium 5. The above-described operation concerning the ejection of the card medium 5 will be described in detail hereinafter.

Referring to FIG. 3B, the slot 31 includes a slot substrate 41. On the slot substrate 41, there is arranged a slot base 42. On the slot base 42, there is disposed a slot connector 42a, and further, there are disposed a slot-left-side guide portion 42b and a slot-right-side guide portion 42c. The slot-left-side guide portion 42b and the slot-right-side guide portion 42c are opposed to each other across the slot connector 42a with a predetermined spacing therebetween.

A plurality of slot electrical contacts 43 are press-fitted in the slot base 42 and held thereon. The slot electrical contacts 43 include power-supply slot electrical contacts 43a and communication slot electrical contacts 43b for transmitting information. Further, a plurality of slot thermal contacts (second thermal contacts) 44 are press-fitted in the slot base 42 and held thereon. The slot thermal contacts 44 are exposed from the slot base 42 both in inserting and removing directions of the card medium 5.

Further, a slot cover 45 is engaged with the slot base 42, and the eject button 46 is disposed on the slot cover 45. Further, the eject mechanism, denoted by reference numeral 47, is provided on the slot cover 45. The card medium 5 is inserted into the slot 31 in a direction indicated by an arrow 50 in FIG. 3B. The card medium 5 has a left side surface provided with a card-left-side guide portion 55a, and a right side surface provided with a card-right-side guide portion 56a, as viewed in the inserting direction of the card medium 5.

As described above, the slot 31 includes the slot base 42, the slot electrical contacts 43, the slot thermal contacts 44, and the slot cover 45.

The slot base 42 is molded of LCP (liquid crystal polymer) from the viewpoints of a heat resisting property high enough resist reflow soldering, thinness for forming a compact and thin shape, flowability that enables formation of a complicated shape, slidability, and so forth. Each slot electrical contact 43 is molded by performing predetermined plating (such as gold plating) on phosphor bronze from the viewpoints of a spring property for bringing itself into contact with a mating contact, solder wettability, contact electric resistance, and so forth. Each slot thermal contact 44 is formed by performing predetermined plating (such as hard chrome plating) on pure copper or copper alloy from the viewpoints of thermal conductivity, slidability, wear resistance, and so forth. The slot cover 45 is formed by stainless spring steel from the viewpoints of strength in a thinned state, workability, corrosion resistance, and so forth.

The plating-coated portion of the slot thermal contact 44 has thermal conductivity lower than that of pure copper or copper alloy, but is sufficiently small in thickness (normally, several micrometers), and hence there is no problem in its thermal resistance. On the other hand, it is possible to largely improve hardness of the surface by using e.g. hard chrome plating. That is, it is possible to form a thermal contact having high reliability, which is less prone to scratching when the card medium 5 is inserted and removed. The thermal contact forms a guide surface and is slid, as described hereinafter, and hence it is of great significance to increase the surface hardness thereof.

The card medium 5 is inserted in the direction indicated by the arrow 50 while being roughly positioned by the slot cover 45 (while being guided with slight play). After that, the card medium 5 is precisely positioned by the card-left-side guide portion 55*a* and the slot-left-side guide portion 42*b*, and the card-right-side guide portion 56*a* and the slot-right-side guide portion 42*c*, and is inserted to a communicable position. Finally, the card medium 5 is inserted to a position where a card abutment surface 42*d*, referred to hereinafter, on the slot base 42 and a terminal surface 51, referred to hereinafter, of the card medium 5 are brought into contact with each other. At this position, the slot electrical contacts 43 and card electrical contacts, referred to hereinafter, are brought into contact with each other, whereby stable communication is enabled.

As shown in FIG. 3B, the slot thermal contacts 44 are provided in two which are arranged with a predetermined spacing therebetween, and the plurality of slot electrical contacts 43 are arranged between the two slot thermal contacts 44. Slot electrical contacts close to the respective slot thermal contacts 44 are used as the power-supply slot electrical contacts 43*a* via which signals need not be transmitted at high speed. The power-supply slot electrical contacts 43*a* are used for the power supply 24 and the power supply IC 27, described with reference to FIG. 2B. As described above, since the slot base 42 is formed of LCP which is low in thermal conductivity, the slot thermal contact 44 and the power-supply slot electrical contact 43*a* are thermally insulated from each other.

Ones of the slot electrical contacts 43 arranged laterally inward of the power-supply slot electrical contacts 43*a*, which are away from the slot thermal contacts 44, are the communication slot electrical contacts 43*b*. That is, high-speed signal lines are arranged at respective locations where they are less liable to be affected by heat. In general, twisted pair lines of the same impedance are used for high-speed signal transmission, and it is convenient for signal transmission to arrange high-speed signal lines at locations less affected by heat. The communication slot electrical contacts 43*b* are used for connection between the host controller 25 and the controller 28, appearing in FIG. 2B.

Figure 4A:
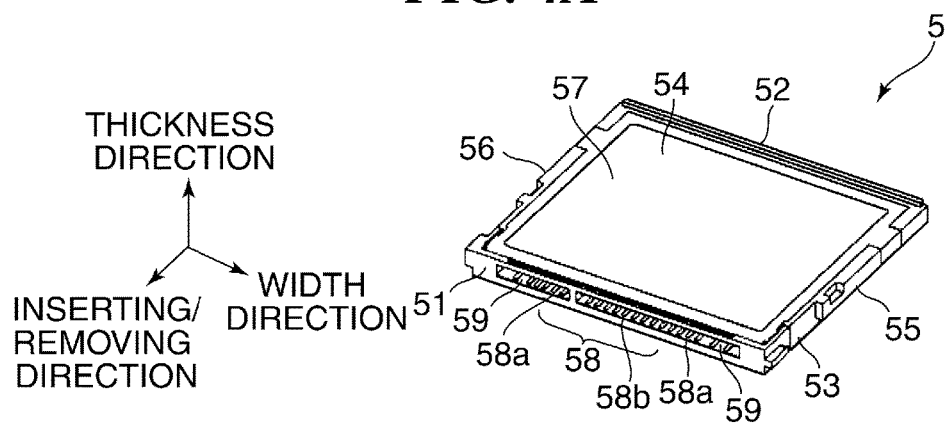
FIGS. 4A to 4E are diagrams useful in explaining the configuration of the card medium appearing in FIGS. 3A and 3B.
Figure 4B:
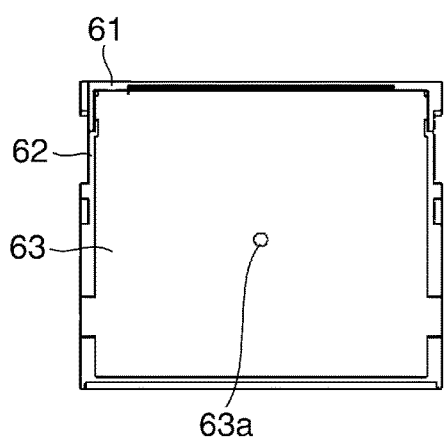
Figure 4C:
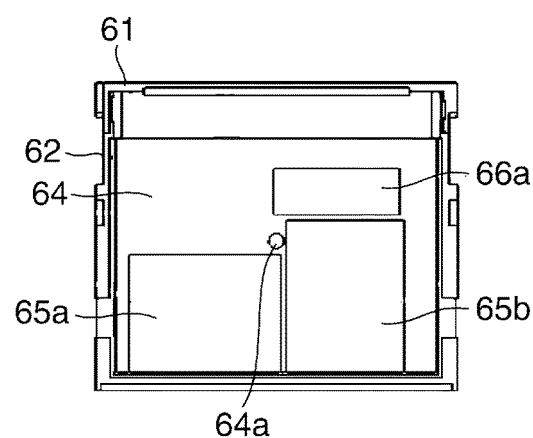
Figure 4D:
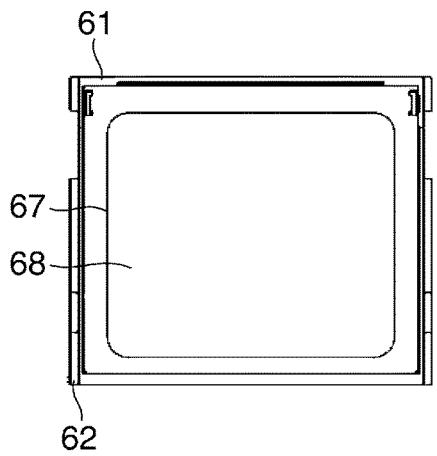
Figure 4E:
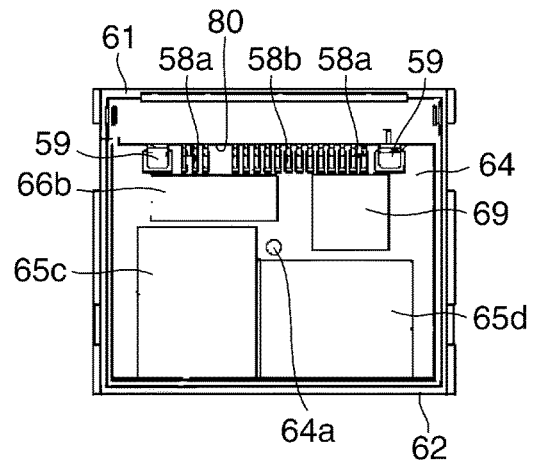

FIGS. 4A to 4E are diagrams useful in explaining the configuration of the card medium 5 appearing in FIGS. 3A and 3B, in which FIG. 4A is a perspective view of the card medium 5, FIG. 4B is a view of the same in a state having a card label removed therefrom, as viewed from the upper side thereof, FIG. 4C is a view of the inside of the same, as viewed from the upper side thereof, FIG. 4D is a view of the card medium 5, as viewed from the lower side thereof, and FIG. 4E is a view of the inside of the card medium 5, as viewed from the lower side thereof.

Referring to FIG. 4A, the card medium 5 has the terminal surface 51, and a rear end surface 52 is defined in an opposed relation to the terminal surface 51. Further, a left-side surface 55 and a right-side surface 56, as viewed in the inserting direction of the card medium 5, are opposite to each other, whereby the card medium 5 is defined to have a rectangular shape (card-shape). Surfaces of the card medium 5, which are vertically opposite to each other, are referred to as a first surface 53 and a second surface 54, with a second-surface card label 57 being attached to the second surface 54, and the terminal surface 51 is provided with the card electrical contacts, denoted by reference numeral 58, and card thermal contacts (first thermal contacts) 59.

The card medium 5 is inserted into the slot 31, as described with reference to FIGS. 3A and 3B. A direction in which the card medium 5 is moved when the card medium 5 is inserted or removed is referred to as the inserting/removing direction. In general, the card medium 5 is not inserted and removed in a thickness direction or an oblique direction, and hence the thickness direction of the card medium 5 and the inserting/removing direction are orthogonal to each other (i.e. intersect with each other). Note that the thickness direction is a direction from the first surface 53 toward the second surface 54. Further, a direction orthogonal to the thickness direction and the inserting/removing direction is referred to as the width direction.

In the illustrated example in FIG. 4A, a direction from the first surface 53 toward the second surface 54 in the thickness direction is assumed to be a positive direction. With respect to the inserting/removing direction, a direction in which the card medium 5 is inserted into the slot 31 is assumed to be a positive direction. Further, in the present example, coordinates forming a left-handed system are set. Further, the positive direction with respect to the inserting/removing direction is also referred to as the inserting direction, and a negative direction with respect to the same is also referred to as the removing direction. Further, a main heat source (a controller 69, referred to hereinafter) is assumed to exist on the side of the first surface 53, and the opposite surface to the first surface 53 is the second surface 54.

For convenience of explanation, here, as to the slot 31, a side thereof toward the slot substrate 41 is referred to as the lower side, and as to the card medium 5 as well, a side thereof toward the slot substrate 41 in a state in which the card medium 5 is inserted into the slot 31 and is enabled to perform communication is referred to as the lower side. In the illustrated example in FIG. 4A, the first surface 53 is the lower surface of the card medium 5, and the second surface 54 is the upper surface of the card medium 5. However, the card medium 5 is inserted into the camera body 1 such that the vertical direction of the card medium 5 in FIG. 4A is a horizontal direction of the camera body 1.

As mentioned above, the second surface 54 has the second-surface card label 57 attached thereto. The second-surface card label 57 describes information indicative of standards with which the card medium 5 is compliant, the storage capacity, and communication speed of the card medium 5, and so forth. The arrangement of terminals (contacts) on the card medium 5 corresponds to the arrangement of the terminals (contacts) on the slot, described with reference to FIG. 3B. That is, on the card medium 5, the card thermal contacts 59 are arranged at the outermost locations, and power-supply card electrical contacts 58*a* are arranged inward of the opposite card thermal contacts 59, respectively. Further, communication card electrical contacts 58b are arranged at the innermost locations.

As shown in FIG. 4A, the card electrical contacts 58 and the card thermal contacts 59 are arranged at the same position in the thickness direction. That is, assuming that the card electrical contacts 58 and the card thermal contacts 59 are made different in position in the thickness direction, this increases the thickness of the card medium 5, and hence they are arranged such that they are disposed at the same position in the thickness direction.

FIG. 4B shows the card medium 5 in the state having the second-surface card label 57 removed therefrom, as viewed from the upper side thereof. Further, FIG. 4C shows the card medium 5 in a state in which a second-surface card exterior, referred to hereinafter, is removed therefrom, as viewed from the upper side thereof. Further, FIG. 4D shows the card medium 5, as viewed from the lower side thereof. Furthermore, FIG. 4E shows the card medium 5 in a state in which a first-surface card label and a first-surface card exterior, referred to hereinafter, are removed, as viewed from the lower side thereof. Note that in FIGS. 4B to 4E, the card medium 5 is illustrated such that the terminal surface 51 is on the upper side.

Referring to FIGS. 4B to 4E, the card medium 5 includes a card frame body 62 having a substantially U-shape, and is provided with a card connector 61. Further, the card medium 5 includes the second-surface card exterior, denoted by reference numeral 63, and the second-surface card exterior 63 is formed with a hole 63a. A card substrate 64 is mounted in the card medium 5, and in the illustrated example, an area for mounting flash memories 65a to 65d is arranged on the card substrate 64. Further, areas 66a and 66b for mounting components other than the flash memories 65a to 65d and the card controller (hereinafter simply referred to as the controller) 69 are arranged on the card substrate 64. Further, the card medium 5 includes the first-surface card exterior, denoted by reference numeral 67, and the first-surface card label, denoted by reference numeral 68.

In the card medium 5, the card substrate 64 and the card connector 61 are connected by soldering, and the card frame body 62 and the card connector 61 are assembled to each other. Further, the first-surface card exterior 67 and the second-surface card exterior 63 are fitted in from the upper and lower sides, respectively, and are assembled by snap-fitting (so-called click clamping). Thus, the outer shape of the card medium 5 is completed to form a card casing. That is, the card casing includes the card connector 61, the card frame body 62, the second-surface card exterior 63, and the first-surface card exterior 67.

In this state, a potting material is injected from the hole 63a. Then, the first-surface card label 68 and the second-surface card label 57 are attached and heated, whereby the card medium 5 is completed. The potting material is cured by heating to thereby promote heat conduction on the card medium 5. Further, the sturdiness and weatherability of the card medium 5 are improved.

Note that components other than the above-mentioned components are fixed to the card connector 61 or the card substrate 64 by press-fitting or soldering. Further, in FIGS. 4A to 4E, illustration of the potting material makes the structure of the card medium 5 unclear, and hence the potting material is omitted from illustration.

The card connector 61 is molded of LCP so as to make the same resistant to heat, and thin and compact, similarly to the slot base 42. Further, each card electrical contact 58 is not formed to have a spring property, and is formed by plating (such as gold plating) pure copper or copper alloy, by considering solder wettability, contact electric resistance, and so forth.

Each card thermal contact 59 is formed by plating (such as hard chrome plating) pure copper or copper alloy, by considering thermal conductivity, slidability, wear resistance, and so forth. The surface hardness can be largely improved by the plating-coated portion without affecting thermal resistance, similarly to the slot thermal contact. That is, it is possible to form the card thermal contact 59 having high reliability, which is less prone to scratching when the card medium 5 is inserted and removed. The card thermal contacts 59 are provided in pair in a manner spaced from each other with a predetermined distance in the width direction in which the electrical contacts are arranged. As described above, by providing the card thermal contacts 59 in pair, it is possible to prevent tilt of the whole card medium 5, and thereby ensure stable contact of the card thermal contacts 59. As shown in FIG. 4A, a surface of each card thermal contact 59 is a surface which is brought into contact with an associated one of the slot thermal contacts 44 provided on the slot 31. The contact surface is thus provided in a direction orthogonal to the thickness direction of the card medium 5.

The card connector 61 is formed with a hole 80, in which the card electrical contacts 58 and the card thermal contacts 59 are press-fitted and held.

The card substrate 64 has the flash memories 65a to 65d and the controller 69 arranged thereon. Further, although not shown in detail, the power supply IC 27, a capacitor, and so forth, are mounted in the areas 66a and 66b. The controller 69 is the highest in power consumption in the card medium 5, and is the main heat source. The flash memories 65a to 65d are other heat sources.

The card substrate 64 is formed with a hole 64a, and the potting material can flow from the second surface toward the first surface. The card substrate 64 is formed with an area for mounting the card connector 61 thereon, and the card substrate 64 and the card connector 61 are positioned and fixed to each other by soldering. The first-surface card label 68 is attached to the first surface as the lower surface of the card medium 5, and is used by a user as a note space or the like.

Figure 5A:
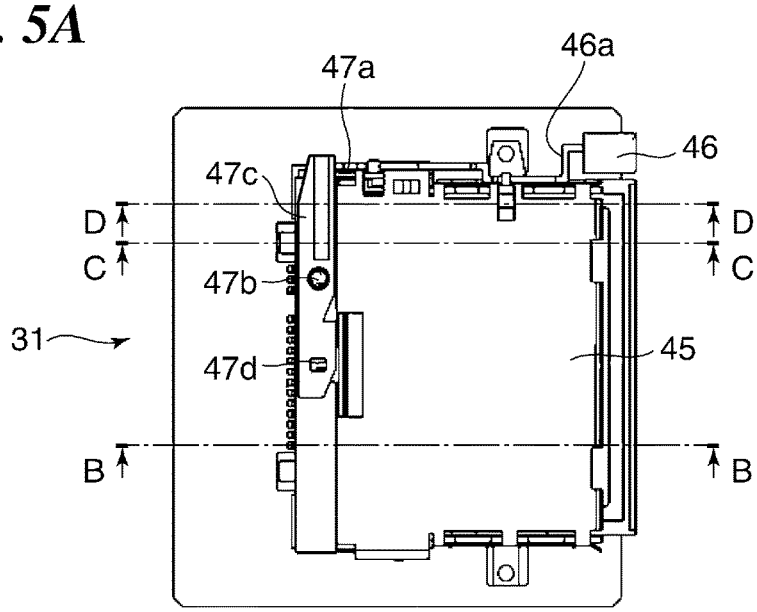
FIGS. 5A to 5D are diagrams useful in explaining the arrangement of the components in a thickness direction of the card medium shown in FIGS. 4A to 4E.
Figure 5B:
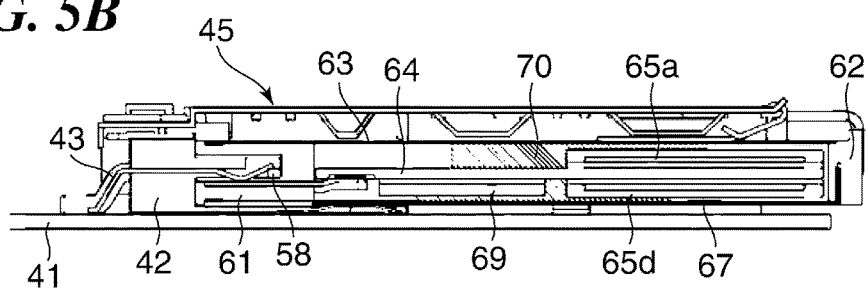
Figure 5C:
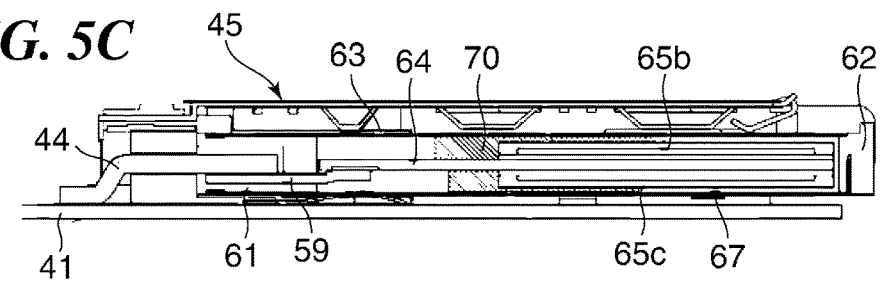
Figure 5D:
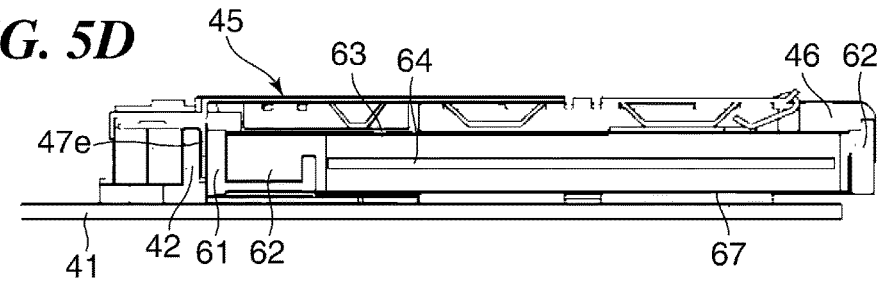

FIGS. 5A to 5D are diagrams useful in explaining the arrangement of the components in the thickness direction of the card medium shown in FIGS. 4A to 4E, in which FIG. 5A shows the card medium, as viewed from the upper side thereof, and FIGS. 5B, 5C, and 5D are cross-sectional views of the card medium taken along B-B, C-C, and D-D in FIG. 5A, respectively.

Referring to FIG. 5A, the eject mechanism 47 is provided on the slot cover 45, and includes the eject button 46, an eject arm 47a interlocked with the eject button 46, an rotary arm 47c which is rotated about a rotation center 47b, and an eject plate, portions of which are shown. The illustrated portions of the eject plate are a lug 47d appearing in FIG. 5A and legs 47e provided at opposite ends thereof in the width direction orthogonal to the inserting/removing direction (one of the legs 47e appears in FIG. 5D).

FIG. 5B shows a cross section at a position including one of the slot electrical contacts 43 and the controller 69 as the main heat source. The controller 69 is mounted on a side of the card substrate 64, toward the slot substrate 41. The controller 69 is connected to the first-surface card exterior 67 via the potting material, denoted by reference numeral 70. The flash memories 65a and 65d as the other heat sources are mounted on the opposite sides of the card substrate 64, respectively. The flash memories 65*a* and 65*d* are connected to the second-surface card exterior 63 and the first-surface card exterior 67, respectively, via the potting material 70, similarly to the controller 69.

By filling spaces between the heat sources and the exteriors with the potting material as described above, it is possible to reduce thermal resistance, compared with a case where the spaces are left as air gaps. This makes it possible to more efficiently guide heat from the heat sources to the first-surface card exterior 67 and the second-surface card exterior 63 of the card medium 5.

As mentioned hereinabove, the slot electrical contacts 43 each have a spring property, and are brought into contact with the card electrical contacts 58 while pressing the card electrical contacts 58 from the upper side to the lower side as viewed in FIG. 5B. The position of the card electrical contacts 58 in the thickness direction is determined by the contact between the slot thermal contacts 44 and the card thermal contacts 59. By properly setting this position, the contact between the slot electrical contacts 43 and the card electrical contacts 58 becomes a desired one. For example, the position of the card electrical contacts 58 for performing electrical communication is set to a position higher than a lower end position of the slot electrical contacts 43 in a state in which the card medium 5 is not inserted, and lower than a position which corresponds to a limit of elasticity of the slot electrical contacts 43. By setting the position as above, the contact between the slot electrical contacts 43 and the card electrical contacts 58 becomes a desired state.

When focusing on the inserting/removing direction, the card abutment surface 42*d* of the slot base 42 and the terminal surface 51 of the card medium 5 are in contact with each other. In this position, the card electrical contacts 58 and the slot electrical contacts 43 are in a matching position with respect to the inserting/removing direction. More specifically, the card electrical contacts 58 extend in the inserting/removing direction, and the slot electrical contacts 43 can be brought into contact with the card electrical contacts 58 at a certain position in which the card electrical contacts 58 extend.

FIG. 5C shows a cross section at a position including one of the slot thermal contacts 44. The flash memories 65*b* and 65*c* as the other heat sources are mounted on the opposite surfaces of the card substrate 64, respectively. The flash memories 65*b* and 65*c* are connected to the first-surface card exterior 67 and the second-surface card exterior 63 via the potting material 70, respectively, similarly to the controller 69 appearing in FIG. 5B. Also in this state, by filling the spaces between the heat sources and the exteriors with the potting material 70, it is possible to reduce thermal resistance, compared with a case where the spaces are left as air gaps. This makes it possible to more efficiently guide heat from the heat sources to the first-surface card exterior 67 and the second-surface card exterior 63 of the card medium 5.

Each slot thermal contact 44 is formed of copper alloy having no spring property, and is brought into surface contact with an associated one of the card thermal contacts 59 by a card pressing spring 90, referred to hereinafter. Heat from the controller 69 and the like as the heat sources of the card medium 5 is sequentially transferred via the card substrate 64 in the following transfer path of the card thermal contacts 59, the slot thermal contacts 44, and the slot substrate 41. Then, the heat is exhausted from the slot substrate 41 to the outside via the heat transfer section 15 appearing in FIG. 1.

In the above-described heat exhaust path, thermal resistance of each part is small. More specifically, the controller 69 and the card substrate 64, the card substrate 64 and the card thermal contacts 59, and the slot thermal contacts 44 and the slot substrate 41 are soldered to each other, respectively, and hence the thermal resistance is small. The card substrate 64 and the slot substrate 41 are each formed by a multi-layer substrate, and are patterned such that a large amount of copper remains e.g. by arranging the power supply and the ground (so-called solid ground pattern) in an intermediate layer, and hence the thermal resistance is small. Each slot thermal contact 44 and each card thermal contact 59 are formed of copper alloy, and hence the thermal resistance is small. Further, the slot thermal contacts 44 and the card thermal contacts 59 are brought into surface contact with each other to thereby reduce thermal resistance generated by the contact. Therefore, the thermal resistance is small in this connection as well. Thus, it is possible to sufficiently reduce the thermal resistance of each part, and hence it is possible to efficiently exhaust heat to the outside through the above-mentioned heat exhaust path.

FIG. 5D shows a cross section at a position including the eject mechanism 47. Here, a description will be given of the operation of the eject mechanism 47 with reference to FIGS. 5A and 5D.

The rotary arm 47*c* is arranged to be rotatable about the rotation center 47*b* fitted on a protrusion, not shown, formed on the slot cover 45. The rotary arm 47*c* is rotatably engaged with the lug 47*d*. The eject arm 47*a* connected to the rotary arm 47*c* is guided by a guiding protrusion provided on the slot cover 45, and is held in a manner slidable only in a left-right direction as viewed in FIG. 5A (inserting/removing direction of the card medium 5). Further, the eject button 46 is disposed at an extremity of the eject arm 47*a* via a link portion 46*a*. Further, the eject plate including the lug 47*d* and the legs 47*e* is held by guide portions, not shown, provided on the slot cover 45 in a manner slidable only in the left-right direction in FIG. 5A, similarly to the eject arm 47*a*.

With the above arrangement, when the eject arm 47*a* is moved to the left, the eject plate including the lug 47*d* is moved in an opposite direction, i.e. to the right.

As described hereinabove with reference to FIG. 3A, when the card medium 5 is inserted into the slot 31, the eject button 46 is protruded. At this time, as shown in FIG. 5D, the card medium 5 is inserted while pushing in the legs 47*e* (hence the eject plate which includes the legs 47*e* and the lug 47*d* rotatably engaged with the rotary arm 47*c*). As a result, in FIG. 5A, the lug 47*d* (included in the eject plate) is moved to the left, and the rotary arm 47*c* is rotated about the rotation center 47*b* in a clockwise direction, whereby the eject arm 47*a* is moved to the right. This causes the eject button 46 to protrude.

When removing the card medium 5, the eject button 46 is pressed in. As a result, in FIG. 5A, the eject arm 47*a* is moved to the left, and the rotary arm 47*c* is rotated in an anticlockwise direction, whereby the lug 47*d* is moved to the right. This causes the eject plate including the lug 47*d* to push the card medium 5 out of the slot 31.

FIGS. 6A to 6D are diagrams useful in explaining the inserted and removed states of the card medium, shown in FIGS. 4A to 4E, and each showing a state in which the position of the card medium in the inserting/removing direction is changed.

Figure 6A:
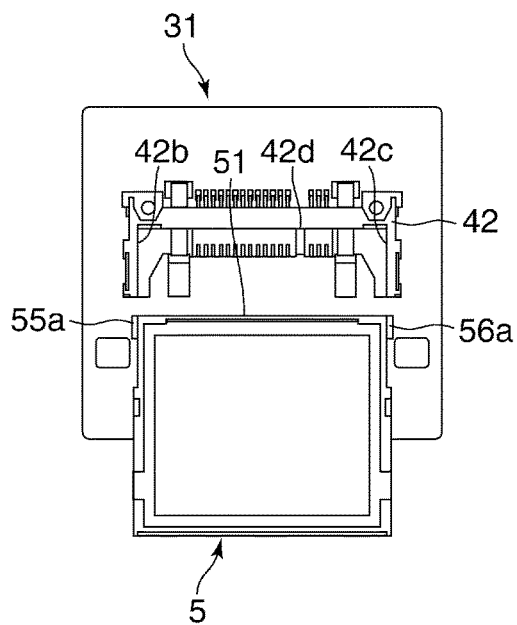
FIGS. 6A to 6D are diagrams useful in explaining the inserted and removed states of the card medium shown in FIGS. 4A to 4E.
Figure 6B:
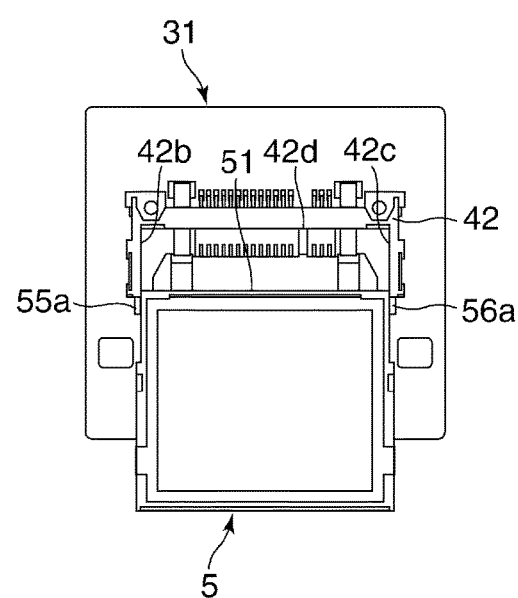
Figure 6C:
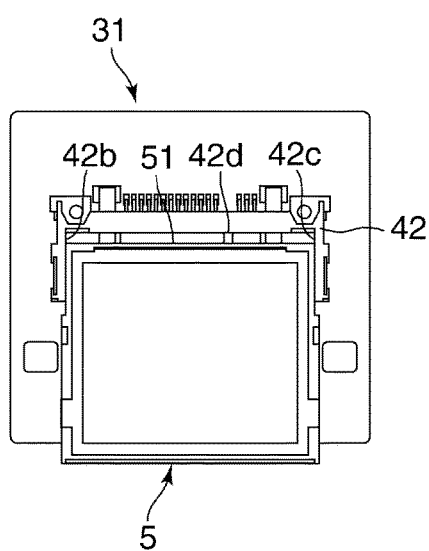
Figure 6D:
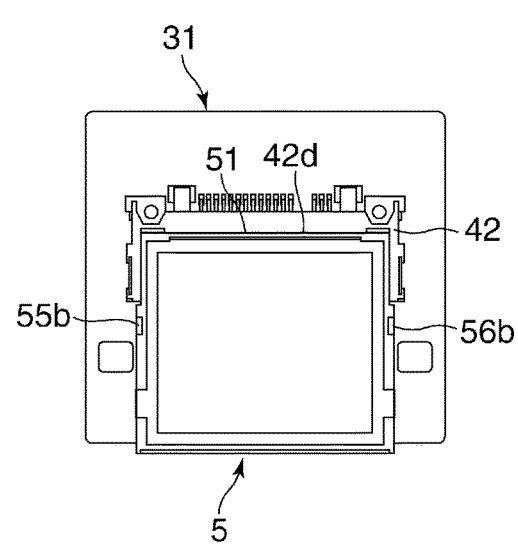

As shown in FIG. 6D, the left-side surface 55 and the right-side surface 56 of the card medium 5 are formed with a right side surface recess 55*b* and a left side surface recess 56*b*, respectively. FIG. 6A shows a state in which the slot base 42 and the card medium 5 are not in contact. In this state, the card medium 5 is being guided with a large gap from the slot cover (not appearing in FIGS. 6A to 6D). This state is hereinafter referred to as the insertion preparation state.

FIG. 6B shows a state in which the slot base 42 and the card medium 5 have started to be brought into contact with each other. In this case, the card-left-side guide portion 55a and the slot-left-side guide portion 42b are brought into contact with each other. Also, the card-right-side guide portion 56a and the slot-right-side guide portion 42c are brought into contact with each other. As a result, the card medium 5 is guided. This state is hereinafter referred to as the first insertion state. The first insertion state corresponds to a range in which the card medium 5 is not moved in the thickness direction when the card medium 5 is moved in the inserting direction from the position where the contact between the card medium 5 and the slot base 42 is started.

FIG. 6C shows the position of the card medium 5 which is further inserted with respect to the slot base 42 before reaching a third insertion state. This state is referred to as the second insertion state. The second insertion state corresponds to a range from a position where the card medium 5 starts to be moved in the thickness direction to a position of the card medium 5 immediately before reaching the third insertion state.

FIG. 6D shows a state in which insertion of the card medium 5 with respect to the slot base 42 is completed, and the terminal surface 51 and the card abutment surface 42d are brought into contact with each other. In this state, the card medium 5 is enabled to perform electrical communication and the like. This state is referred to as the third insertion state. In the third insertion state, spring portions, not shown, provided on the slot cover 45 are brought into contact with the right side surface recess 55b and the left side surface recess 56b. This prevents the card medium 5 from being removed, and a pressing force is applied in a direction in which the terminal surface 51 and the card abutment surface 42d are brought into contact with each other.

Figure 7A:
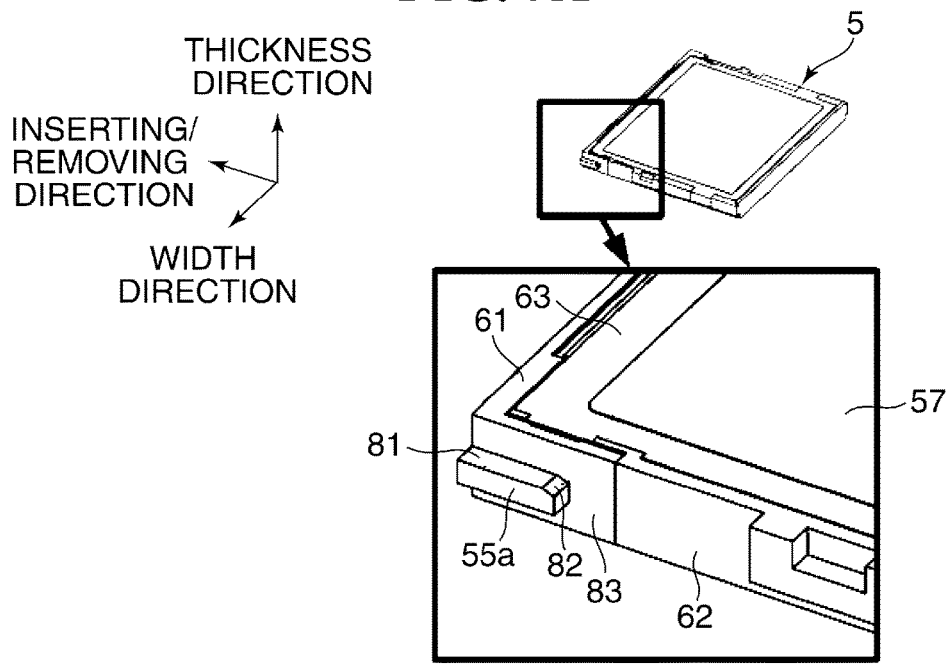
FIGS. 7A and 7B are diagrams useful in explaining details of the card medium and a slot according to the first embodiment.
Figure 7B:
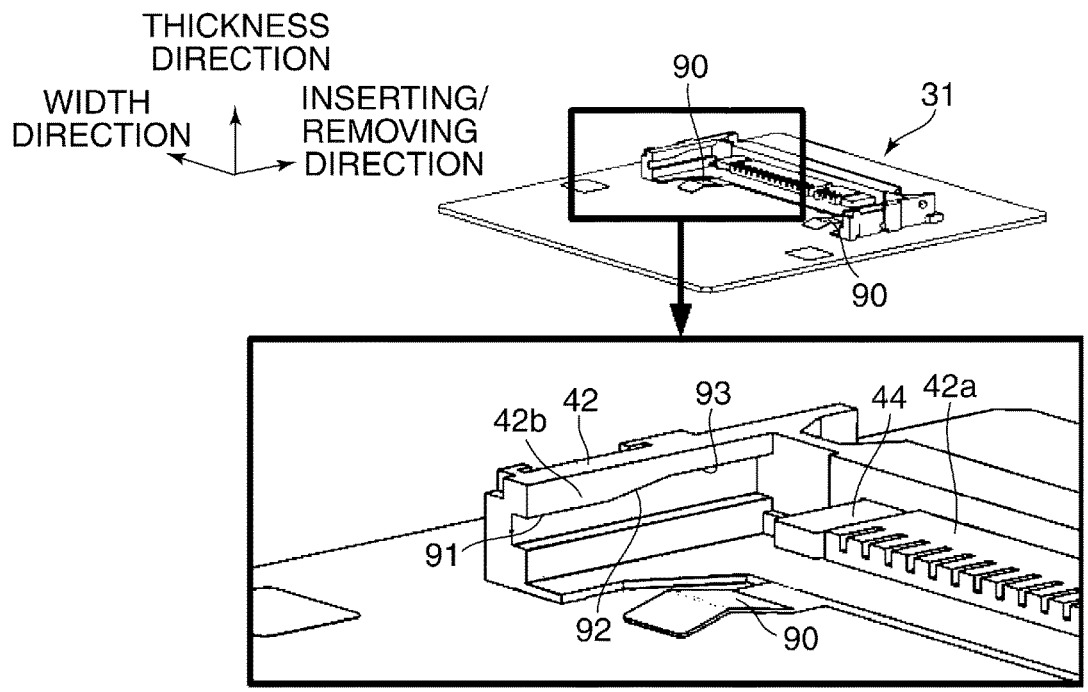

FIGS. 7A and 7B are diagrams useful in explaining details of the card medium 5 and the slot 31 according to the first embodiment, in which FIG. 7A shows the card medium 5 together with an enlarged part thereof, and FIG. 7B shows the slot 31 together with an enlarged part thereof.

Referring to FIG. 7A, the card-left-side guide portion 55a of the left-side surface 55 of the card connector 61 is formed with a first card upper guide surface 81 and a second card upper guide surface 82. Note that an escape portion 83 is part of the left-side surface 55 of the card medium 5, which is not formed with the card-left-side guide portion 55a.

The card-left-side guide portion 55a is formed to have a predetermined length over which it extends from the terminal surface 51 in the card inserting/removing direction. The first card upper guide surface 81 and the second card upper guide surface 82, formed on the card-left-side guide portion 55a, are brought into contact with the slot-left-side guide portion 42b by the card pressing spring 90, described hereinafter with reference to FIG. 7B.

Note that detailed description will be given hereinafter of the contact/separation states of the first card upper guide surface 81, the second card upper guide surface 82, and the escape portion 83 in the first insertion state, the second insertion state, and the third insertion state, with reference to FIGS. 6B to 6D.

The first card upper guide surface (first height restriction portion) 81 is a flat surface which extends orthogonal to the thickness direction and is brought into contact with the slot 31 when the card medium 5 is pressed in the thickness direction. The escape portion (second height restriction portion) 83 is an escape portion on the side surface of the card medium 5 with respect to the engagement portion on the slot 31. The escape portion 83 is only required to be different in height in the thickness direction from the first card upper guide surface 81. That is, the escape portion 83 may be formed on a portion protruding from the side surface of the card medium 5 differently from the card-left-side guide portion 55a.

The second card upper guide surface (third height restriction portion) 82 is formed on a surface smoothly connecting (i.e. linking) between the first card upper guide surface (first height restriction portion) 81 and the escape portion (second height restriction portion) 83. Note that the term "smooth connection" is intended to mean connection between the first height restriction portion and the second height restriction portion by the third height restriction portion formed such that the position of the third height restriction portion in the thickness direction undergoes gradual change. For example, the first card upper guide surface 81 and the escape portion 83 may be connected by forming a chamfered surface or a tapered surface. This makes it possible to smoothly perform the removal operation as described hereinafter.

As is clear from FIG. 7A or 4A, the first card upper guide surface 81 is formed to have a length extending from the terminal surface 51 in the card inserting/removing direction, which corresponds to a little over 10% of the length of the card medium 5. The length of the first card upper guide surface 81 in the card inserting/removing direction is only required to be a predetermined length not larger than half the length of the card medium 5 in the same direction.

By forming the first card upper guide surface 81 from the terminal surface 51, it is possible to smoothly shift the insertion state from the insertion preparation state, shown in FIG. 6A, to the first insertion state. Further, the first card upper guide surface 81 is formed to have a predetermined length in the card inserting/removing direction, and hence this not only enables the user to easily insert and remove the card medium 5, but also makes it unnecessary to increase the size of a guide part on the slot more than necessary, i.e. this makes it possible to reduce the size of the slot, and smoothly insert and remove the card medium 5.

Referring to FIG. 7B, the slot 31 is provided with the card pressing spring (urging portion) 90, and the slot-left-side guide portion 42b is formed with a first slot upper guide surface 91, a second slot upper guide surface 92, and a third slot upper guide surface 93.

Figure 8A:
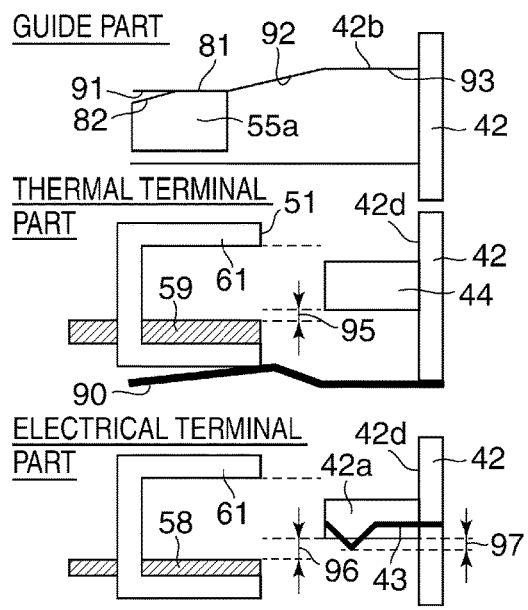
FIGS. 8A to 8D are diagrams useful in explaining the contact and separation states of the card medium and the slot shown in FIGS. 7A and 7B.
Figure 8B:
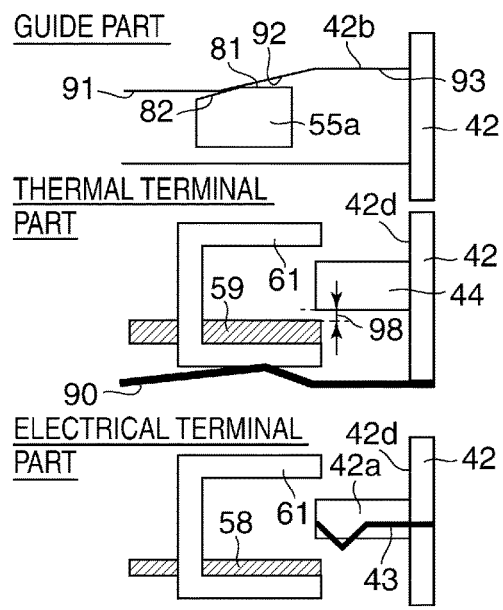
Figure 8C:
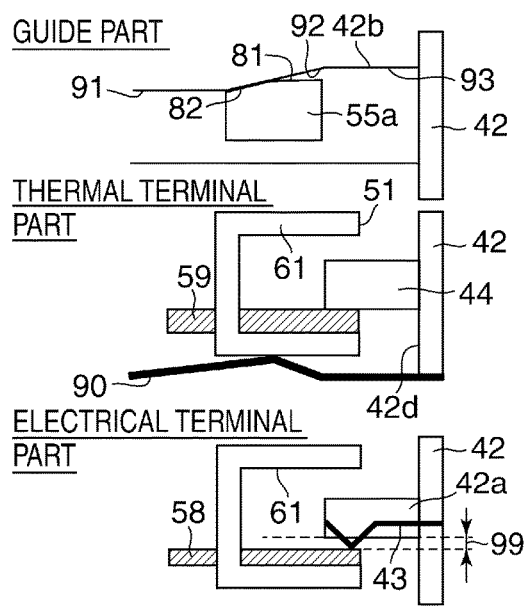
Figure 8D:
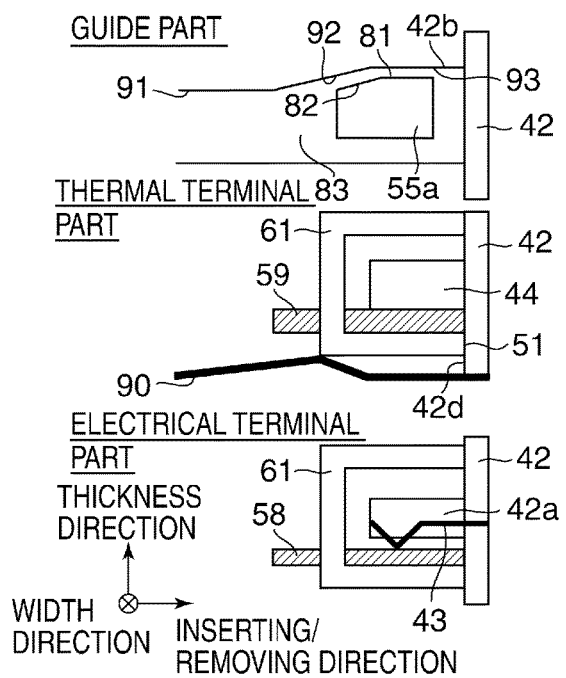

FIGS. 8A to 8D are diagrams useful in explaining the contact and separation states of the card medium 5 and the slot 31, shown in FIGS. 7A and 7B, in which FIG. 8A shows the contact/separation states of the first slot upper guide surface 91, the second slot upper guide surface 92, and the third slot upper guide surface 93, in the first insertion state described with reference to FIG. 6B. FIG. 8B shows the contact/separation states of the first slot upper guide surface 91, the second slot upper guide surface 92, and the third slot upper guide surface 93, in the second insertion state described with reference to FIG. 6C. FIG. 8C shows the contact/separation states of the first slot upper guide surface 91, the second slot upper guide surface 92, and the third slot upper guide surface 93, in the third insertion state described with reference to FIG. 6D. FIG. 8D shows a state in which the card thermal contacts and the slot thermal contacts are completely brought into contact with each other. Note that FIGS. 8A to 8D each schematically show the respective cross sections of the guide part formed by the first to third slot upper guide surfaces 91, 92, and 93 of the slot 31, a thermal terminal part including the card thermal contact 59, and an electrical terminal part including the card electrical contact 58.

The first slot upper guide surface (first guide surface) 91 is a flat surface which extends orthogonal to the thickness direction of the card medium 5 and restricts the position of the card medium 5 in the thickness direction. The third slot upper guide surface (second guide surface) 93 is a surface which restricts the position of the card medium 5 in the thickness direction to a position different from a position in the thickness direction to which the position of the card medium 5 is restricted by the first slot upper guide surface 91. The second slot upper guide surface (third guide surface) 92 is a surface smoothly connecting between the first slot upper guide surface 91 and the third slot upper guide surface 93. For example, the second slot upper guide surface (third guide surface) 92 is a chamfered surface or a tapered surface which connects between the first slot upper guide surface 91 and the third slot upper guide surface 93.

Each card pressing spring 90 presses (urges) the card medium 5 in the positive direction with respect to the thickness direction when the card medium 5 is inserted into the slot 31. The position of the card pressing springs 90 in the inserting/removing direction is determined such that its pressing force in the thickness direction is generated after the card-left-side guide portion 55a and the slot-left-side guide portion 42b are brought into contact with each other. Note that the card pressing springs 90 and the guide surfaces may be symmetrically arranged on the slot 31.

Reference numeral 95 indicates a gap formed between the slot thermal contacts 44 and the card thermal contacts 59 in the thickness direction in the first insertion state. Reference numeral 96 indicates a gap formed between the slot connector 42a and the card electrical contacts 58 in the thickness direction in the first insertion state. Reference numeral 97 indicates a gap formed between lower ends of the slot electrical contacts 43 and the slot connector 42a in a natural state (state in which the spring is not pressed). Reference numeral 98 indicates a gap formed between the slot thermal contacts 44 and the card thermal contacts 59 in the thickness direction in the second insertion state. Reference numeral 99 indicates a gap formed between the card electrical contacts 58 and the lower ends of the slot electrical contacts 43 in the thickness direction in a state in which the slot thermal contacts 44 and the card thermal contacts 59 are in contact in the thickness direction.

Referring to FIG. 8A, the card medium 5 is pressed upward by the card pressing springs 90 from below (in the positive direction with respect to the thickness direction). The first card upper guide surface 81 of the card-left-side guide portion 55a and the first slot upper guide surface 91 of the slot-left-side guide portion 42b are brought into contact with each other by the pressing force. At this time, the card thermal contacts 59 and the slot thermal contacts 44 are spaced from each other with the gap 95 therebetween in the thickness direction. Similarly, the card electrical contacts 58 and the slot connector 42a are spaced from each other with the gap 96 therebetween in the thickness direction.

These gaps make it possible to insert the card medium 5 without interference when the card medium 5 is moved in the insertion direction. Further, the gap 97 is formed between the lower ends of the slot electrical contacts 43 and the slot connector 42a in the natural state, and from this state, when the card electrical contacts 58 spaced from the slot connector 42a in the thickness direction by the gap 96 is inserted, the slot electrical contacts 43 are brought into contact with the card electrical contacts 58 while being elastically deformed, whereby it is possible to perform stable communication.

Referring to FIG. 8B, the card medium 5 is pressed upward by the card pressing springs 90 from below (in the positive direction with respect to the thickness direction). The second card upper guide surface 82 of the card-left-side guide portion 55a and the second slot upper guide surface 92 of the slot-left-side guide portion 42b are brought into contact with each other by the pressing force. The second card upper guide surface 82 and the second slot upper guide surface 92 are formed as the tapered surfaces such that as the card medium 5 is inserted, the card medium 5 is moved upward along the tapered surfaces from below. At this time, the card thermal contacts 59 and the slot thermal contacts 44 are spaced from each other with the gap 98 therebetween in the thickness direction. Further, since the card medium 5 is gradually moved upward from below, the gap 98 is smaller than the gap 95.

Next, referring to FIG. 8C, the card medium 5 is pressed upward by the card pressing springs 90 from below (in the positive direction with respect to the thickness direction). On the other hand, the slot electrical contacts 43 are brought into contact with the card electrical contacts 58, and press the card medium 5 downward from above (in the negative direction with respect to the thickness direction). By making the spring force (urging force) of the card pressing springs 90 larger than a resultant force of the spring forces of the slot electrical contacts 43, the card medium 5 is pressed upward from below (positive direction with respect to the thickness direction). When focusing on the thermal contacts, the card thermal contacts 59 and the slot thermal contacts 44 are brought into contact with each other. Further, the second card upper guide surface 82 of the card-left-side guide portion 55a and the second slot upper guide surface 92 of the slot-left-side guide portion 42b are brought into contact with each other.

When the card medium 5 is further moved in the inserting direction from this state, height restriction comes to be performed not by the card-left-side guide portion 55a, but by the position of contact between the card thermal contacts 59 and the slot thermal contacts 44. That is, even when the card medium 5 is further inserted in the inserting direction, the card medium 5 is not moved in the thickness direction, and the card-left-side guide portion 55a is separated from the slot-left-side guide portion 42b. Note that the gap 99 is smaller than the gap 97 between the lower ends of the slot electrical contacts 43 and the slot connector 42a in the natural state, shown in FIG. 8A. That is, the card electrical contacts 58 are in respective positions where stable communication can be performed.

Referring to FIG. 8D, the card medium 5 is pressed upward by the card pressing springs 90 from below (in the positive direction with respect to the thickness direction). The card thermal contacts 59 and the slot thermal contacts 44 are brought into contact with each other by the pressing force. The card-left-side guide portion 55a is in a position opposed to the third slot upper guide surface 93. When the card thermal contacts 59 and the slot thermal contacts 44 are brought into contact with each other in the thickness direction, the third slot upper guide surface 93 and the card-left-side guide portion 55a are separated from each other in the thickness direction. As a result, the card thermal contacts 59 and the slot thermal contacts 44 are stably brought into contact with each other avoiding double fitting.

In the structure shown in FIGS. 7A and 7B, and 8A to 8D, the card pressing springs 90 press the card medium 5 in an opposite direction to the pressing direction of the spring force of the slot electrical contacts 43. In other words, the card pressing springs 90 press the card medium 5 in a direction in which the card electrical contacts 58 and the slot electrical contacts 43 are brought closer to each other. Further, the card pressing springs 90 are stronger in pressing force than the spring force of the slot electrical contacts 43, and hence the card electrical contacts 58 and the slot electrical contacts 43 are stably brought into contact with each other in the third insertion state. As a result, it is possible to perform stable communication.

To reduce thermal resistance, it is necessary to bring the card thermal contacts 59 and the slot thermal contacts 44 into firm contact with each other on a large area. The term "firm contact" is intended to mean "bringing the contacts into contact with each other with reduced air layer" to thereby reduce thermal resistance. In the structure shown in FIGS. 7A and 7B, and 8A to 8D, the card medium 5 is pressed by the card pressing springs 90, and the contact surface where the card medium 5 and each card pressing spring 90 are in contact forms a flat surface orthogonal to the pressing direction of the card pressing springs 90. This makes it possible to bring the card thermal contacts 59 and the slot thermal contacts 44 into firm contact with each other. Further, the contact surface forms a flat surface orthogonal to the thickness direction of the card medium 5.

Since the dimension of the card medium 5 in the thickness direction is limited as mentioned above, if the contact surface between the thermal contacts is set such that it includes the thickness, it is difficult to increase the contact area. On the other hand, if the contact surface between the thermal contacts is set in a direction along a plane orthogonal to the thickness direction of the card medium 5, it is easy to increase the contact area. Note that the size of the contact area between the thermal contacts is determined by taking into account the amount of heat generated in the card medium 5 and so forth.

As described above, the card medium 5 is pressed by the card pressing springs 90 in the positive direction with respect to the thickness direction in the third insertion state. The card pressing springs 90 are provided as a right and left pair, as shown in FIG. 7B, and the resultant force of the card pressing springs 90 is applied in the positive direction with respect to the thickness direction in substantially the center with respect to the width direction of the slot base. On the other hand, as is clear from FIGS. 3B and 4A, the slot thermal contacts 44 and the card thermal contact 59 are provided as respective right and left pairs in the width direction. That is, the plurality of thermal contacts are provided such that the resultant force of the card pressing springs 90 is positioned inward of the thermal contacts in the width direction. This makes it possible to bring the thermal contacts into surface contact with each other without tilting, whereby it is possible to reduce thermal resistance and promote heat dissipation.

Here, a simple description will be given of removal of the card medium 5. As described hereinabove, the slot 31 includes the eject mechanism 47, and when the eject button 46 is pressed, the card medium 5 is discharged from the slot 31. At this time, the card medium 5 in the state shown in FIG. 8D is discharged by transitioning through the states shown in FIGS. 8C, 8B, and 8A in the mentioned order.

When removing the card medium 5, the second card upper guide surface 82 smoothly connects between the first card upper guide surface 81 and the escape portion 83. Further, the second slot upper guide surface 92 smoothly connects between the second slot upper guide surface 92 and the third slot upper guide surface 93. This makes it possible to smoothly remove the card medium 5 without collision of edges with each other in the third insertion state.

As described above, in the first embodiment of the present invention, it is possible to prevent lowering of the reliability due to repeated insertion and removal of the card medium, and thereby improve thermal and electrical connection.

Next, a description will be given of a card medium and a slot according to a second embodiment of the present invention. In the second embodiment, the terminals on the slot side are directly brought into contact with a copper foil (land) on the card substrate.

Figure 9A:
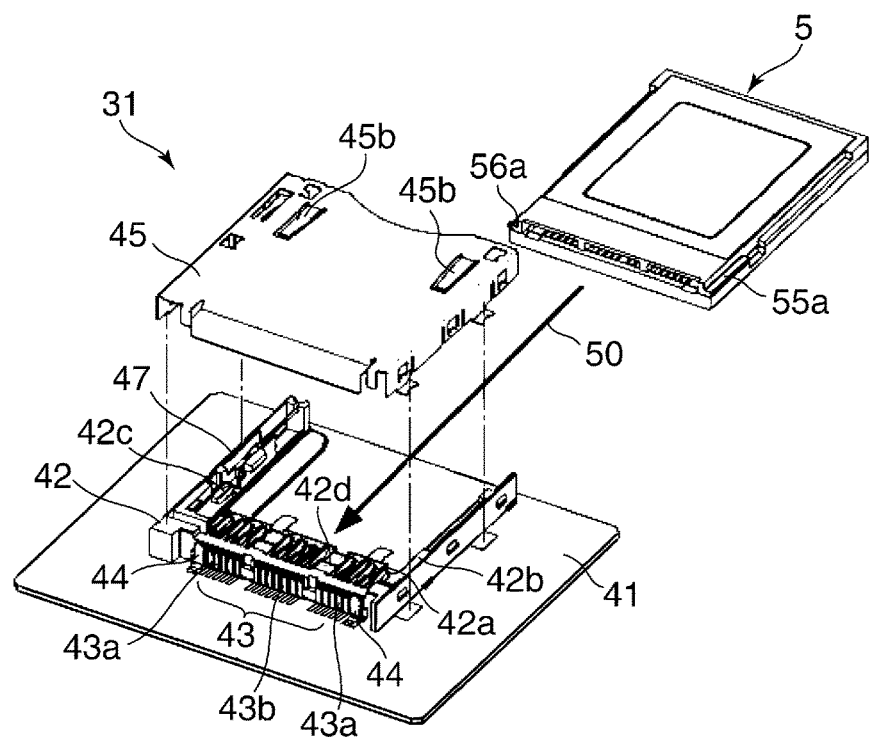
FIGS. 9A and 9B are diagrams useful in explaining a card medium and a slot according to a second embodiment of the present invention.
Figure 9B:
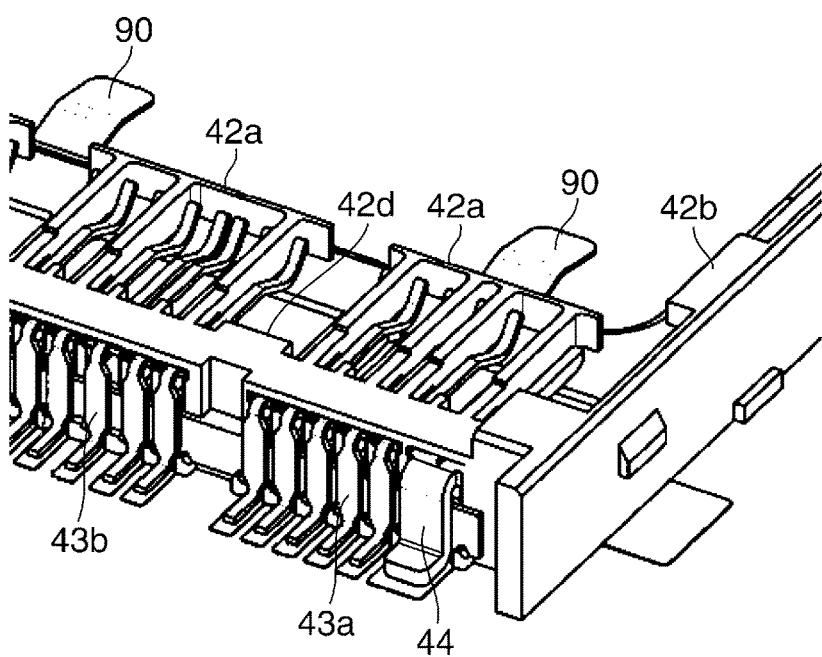

FIGS. 9A and 9B are diagrams useful in explaining the card medium and the slot according to the second embodiment of the present invention, in which FIG. 9A is a perspective view showing the slot in an exploded manner, and FIG. 9B is a perspective view showing part of the slot in an enlarged manner. The same components in FIGS. 9A and 9B as those in FIG. 3B are denoted by the same reference numerals.

As shown in FIG. 9A, slot spring portions 45b are provided on the slot cover 45. In FIG. 9A, the eject mechanism provided on the slot 31 has a structure different from that of the eject mechanism described in the first embodiment, and is a so-called push-lock/push-eject mechanism. This eject mechanism is arranged at a location along the right side surface.

The slot cover 45 is mounted on the slot base 42 by snap-fitting. The slot spring portions 45b provided on the slot cover 45 weakly press the card medium 5 so as to stabilize the posture of the card medium 5 in the insertion preparation state. The slot spring portions 45b press the card medium 5 in the negative direction with respect to the thickness direction.

Similar to the first embodiment, the slot thermal contacts 44 are provided on the opposite ends of the slot 31, respectively, and the card pressing springs 90 are also provided in pair. The card pressing springs 90 press the card medium 5 in the first insertion state, the second insertion state, and the third insertion state, in the similar manner to the first embodiment. The card pressing springs 90 press the card medium 5 in the positive direction with respect to the thickness direction. The card pressing springs 90 press the card medium 5 with a larger force than the above-mentioned slot spring portion 45b. The slot electrical contacts 43 are arranged so as to press the card medium 5 toward the slot substrate 41. The card pressing springs 90 press the card medium 5 in a direction opposite to the direction in which the slot electrical contacts 43 press the card medium 5.

Figure 10A:
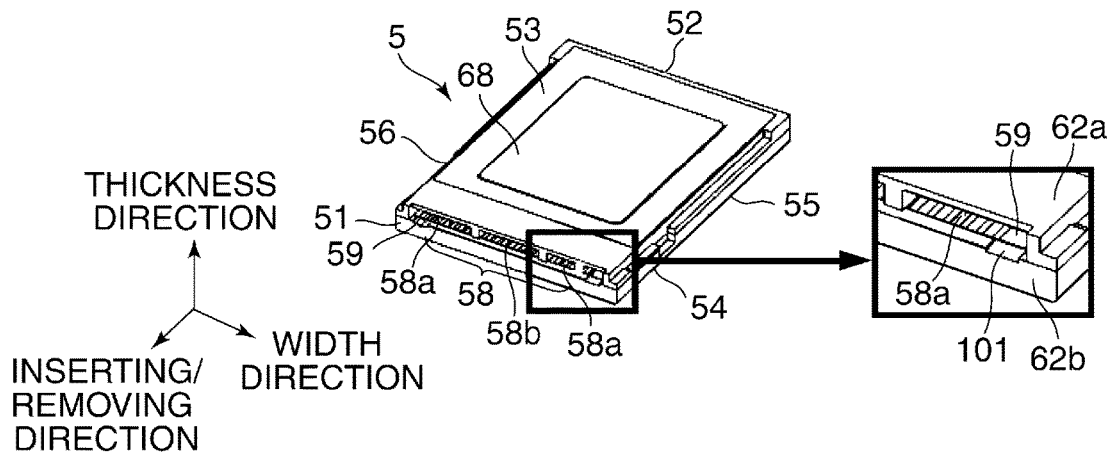
FIGS. 10A to 10E are diagrams useful in explaining the configuration of the card medium appearing in FIGS. 9A and 9B.
Figure 10B:
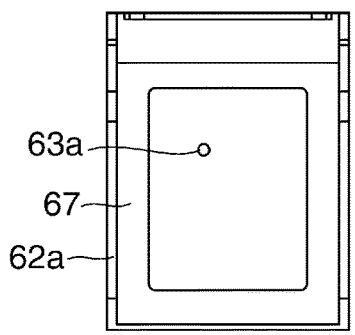
Figure 10C:
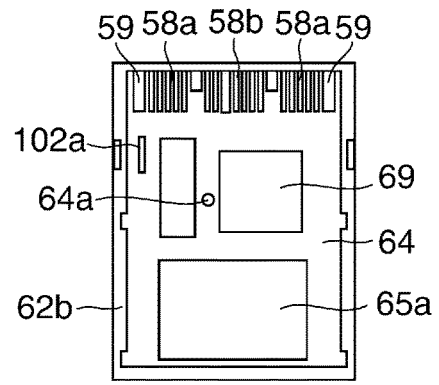
Figure 10D:
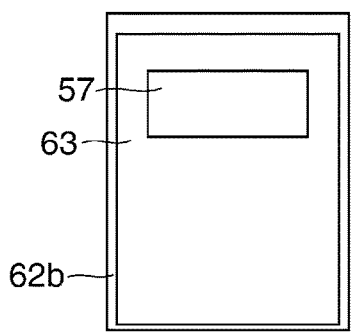
Figure 10E:
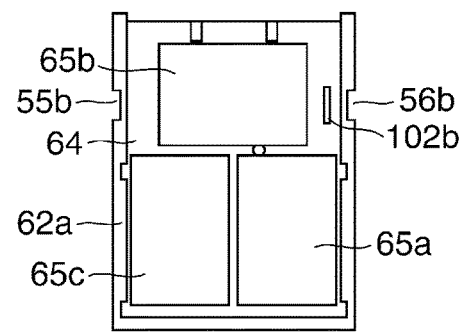

FIGS. 10A to 10E are diagrams useful in explaining the configuration of the card medium appearing in FIGS. 9A and 9B, in which FIG. 10A is a perspective view of the card medium 5, showing together with a diagram showing part of the card medium 5 in an enlarged manner, FIG. 10B shows the card medium 5 in a state in which the card label is removed, as viewed from the upper side thereof, FIG. 10C shows the inside of the card medium 5, as viewed from the upper side thereof, FIG. 10D shows the card medium 5, as viewed from the lower side thereof, and FIG. 10E shows the inside of the card medium 5, as viewed from the lower side thereof. The same components in FIGS. 10A to 10E as those in FIGS. 4A to 4E are denoted by the same reference numerals.

As shown in FIG. 10A in the enlarged manner, the terminal surface 51 is formed with a thermal contact escape surface 101. Further, as shown in FIGS. 10C and 10E, the card substrate 64 is formed with on-board contacts 102a and 102b.

The illustrated card medium 5 has the card electrical contacts 58 and the card thermal contacts 59 formed by lands on the card substrate 64. Further, the controller 69 as the main heat source is located on a positive side of the card substrate 64 in the thickness direction, and the first surface and the second surface are inverted from those of the example shown in FIGS. 4A to 4E. That is, in FIG. 10A, an upper surface is the first surface, and a surface opposed to the slot substrate 41 is the second surface (the first-surface card label 68 is on the upper side in FIG. 10A).

In the second embodiment, although the arrangement of the heat sources on the card medium 5 is different from that in the first embodiment, heat is transferred in the same manner as described in the first embodiment. More specifically, heat from the controller 69 and the like as the representative heat sources of the card medium 5 is transferred via the card substrate 64 in the following transfer path of the card thermal contacts 59, the slot thermal contacts 44, and the slot substrate 41. There is no essential difference between the thermal resistance between the controller 69 and the card substrate 64, and the thermal resistance described with reference to FIGS. 5A to 5D.

In the second embodiment, the advantageous effects thereof do not depend on the arrangement of the heat sources on the card medium 5. On the other hand, on the heat dissipation path via the exterior, the arrangement of the heat sources affects the effect. In the second embodiment, the arrangement of the heat sources can be freely set, and hence a degree of freedom in designing is high. Further, the second embodiment differs from the first embodiment in the structure of the card casing.

In the second embodiment, the card frame body 62 is divided into two, and has a first surface card frame body 62a and a second surface card frame body 62b. In the first surface card frame body 62a, the first-surface card exterior 67 is insert-molded. Further, in the second surface card frame body 62b, the second-surface card exterior 63 is insert-molded. The card substrate 64 is sandwiched between the first surface card frame body 62a and the second surface card frame body 62b to thereby form the card casing. More specifically, the card substrate 64 is roughly positioned into the second surface card frame body 62b e.g. using a cutout. Then, the first surface card frame body 62a and the second surface card frame body 62b are positioned using positioning portions (such as a protrusion and a hole, not shown, formed on/in the first surface card frame body 62a and the second surface card frame body 62b). After that, the peripheral portions of the first surface card frame body 62a and the second surface card frame body 62b are bonded or welded to each other to thereby form the card casing.

As described above, in the second embodiment, the controller 69 is mounted on a different surface from that in the first embodiment. Further, one of the flash memories 65a to 65d as the other heat sources is mounted on the same surface on which the controller 69 is mounted, and the remaining three of them are mounted on a different surface from the surface on which the controller 69 is mounted. Further, the on-board contacts 102a and 102b are mounted on the card substrate 64.

When the card casing is formed, the on-board contacts 102a and 102b are elastically deformed and are brought into contact with the first-surface card exterior 67 and the second-surface card exterior 63, respectively. The contact areas are not large, and hence do not provide sufficient thermal connection (thermal resistance is high), but provide sufficient electrical connection. The electrical connection makes it possible to obtain the advantageous effects of electromagnetic wave shield and the like.

Figure 11A:
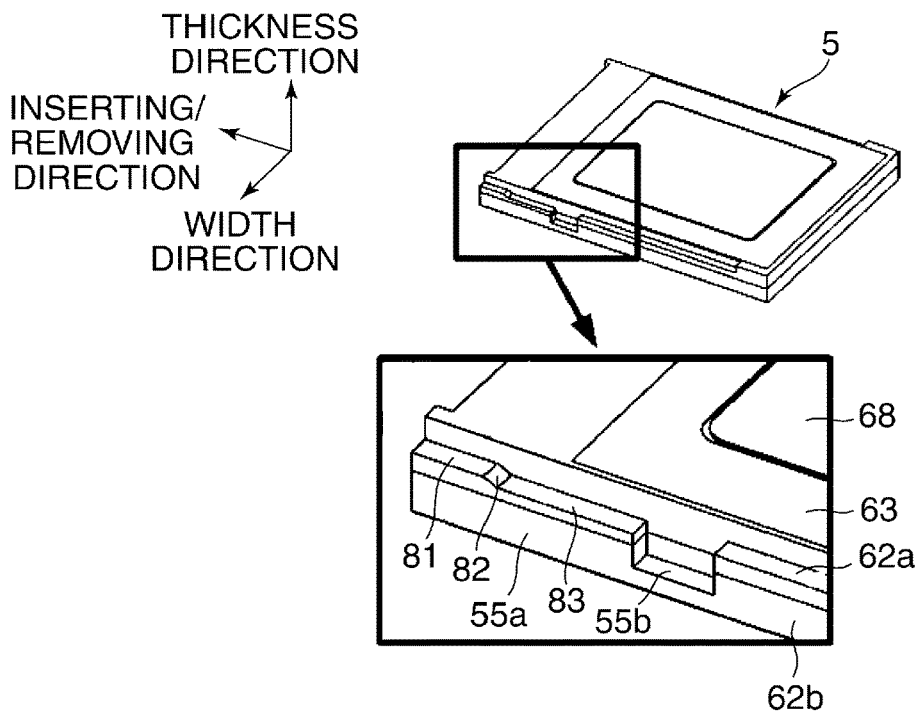
FIGS. 11A and 11B are diagrams useful in explaining details of the card medium and the slot according to the second embodiment.
Figure 11B:
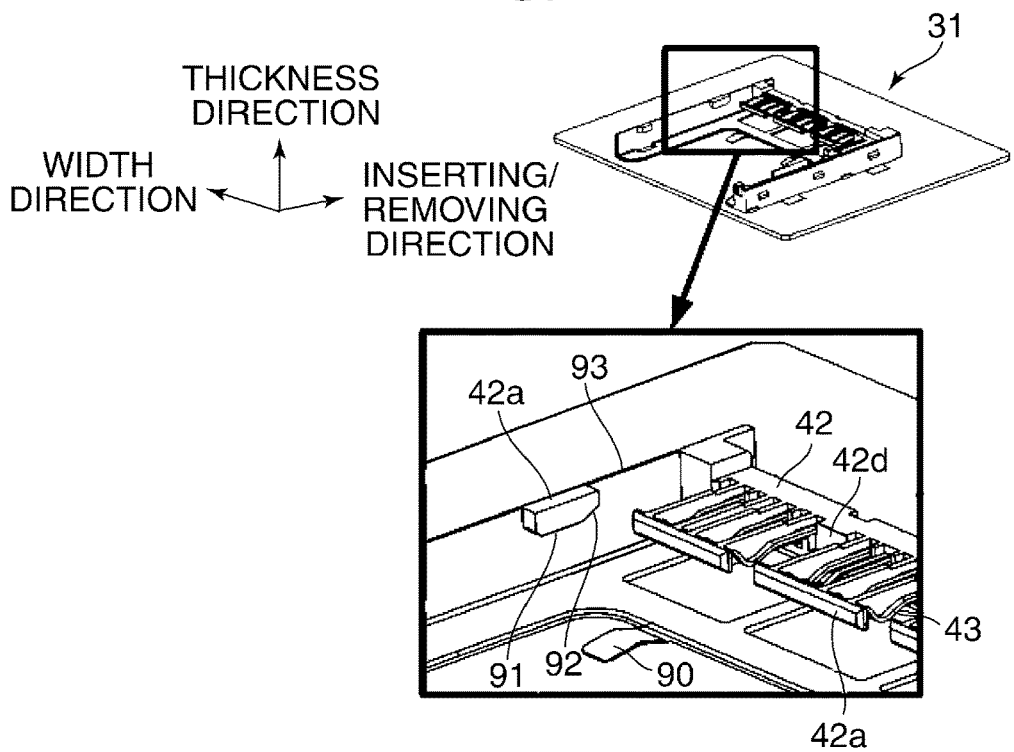

FIGS. 11A and 11B are diagrams useful in explaining details of the card medium 5 and the slot 31 according to the second embodiment. FIG. 11A shows the card medium 5 and part thereof in an enlarged manner, and FIG. 11B shows the slot 31 and part thereof in an enlarged manner. The same components in FIGS. 11A and 11B as those in FIGS. 7A and 7B are denoted by the same reference numerals.

In the illustrated example in FIGS. 11A and 11B, the third slot upper guide surface 93 is not formed on the slot base 42, and the slot cover 45 forms the third slot upper guide surface 93. Further, the escape portion 83 is not brought into contact with the guide surface, but is formed at a so-called escape position upward of the card-left-side guide portion 55a of the side surface of the card medium 5, with the same height in the width direction. Also in the second embodiment, the slot spring portions 45b provided on the slot cover 45 are brought into contact with the right side surface recess 55b and the left side surface recess 56b (see FIG. 10E), whereby the card medium 5 is pressed in the inserting direction. To stabilize contact of the slot spring portions 45b, the escape portion 83 is formed not as a portion which is not formed with the card-left-side guide portion 55a, but as a recess which gives a clearance in the thickness direction.

Figure 12A:
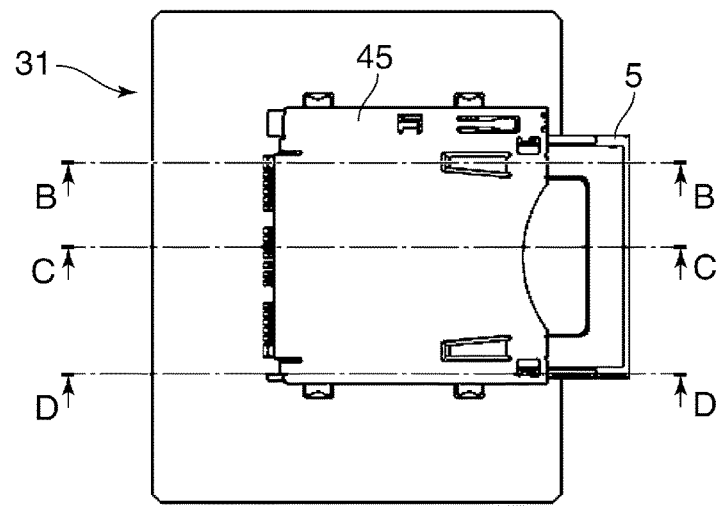
FIGS. 12A to 12D are diagrams useful in explaining the arrangement of the components in the thickness direction of the card medium shown in FIGS. 10A to 10E.
Figure 12B:
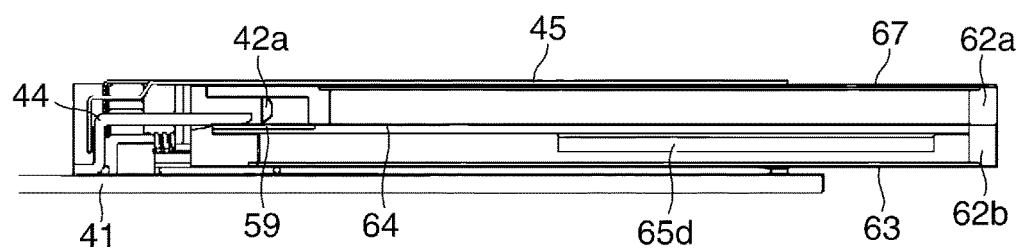
Figure 12C:
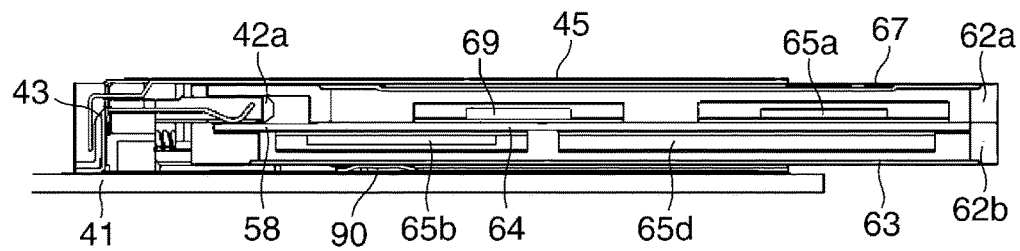
Figure 12D:
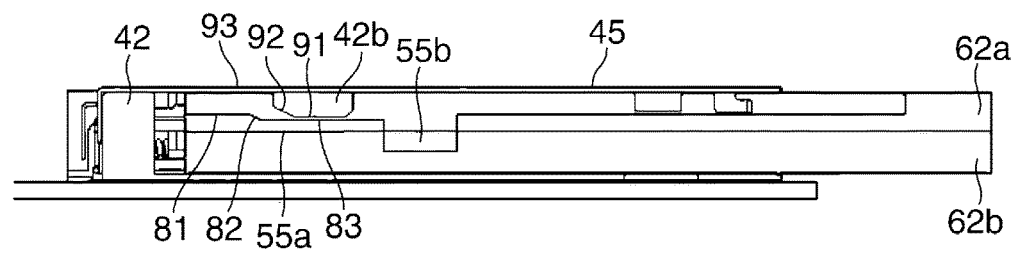

FIGS. 12A to 12D are diagrams useful in explaining the arrangement of the components in the thickness direction of the card medium shown in FIGS. 10A to 10E. FIG. 12A shows the card medium, as viewed from the upper side thereof, and FIGS. 12B, 12C, and 12D are cross-sectional views of the card medium taken along B-B, C-C, and D-D in FIG. 12A, respectively.

FIGS. 12A to 12D each show the third insertion state described in the first embodiment. FIG. 12B shows a cross section of the thermal terminal part including the thermal contact 59, and FIG. 12C shows a cross section of the electrical terminal part including the electrical contact 58. Further, FIG. 12D shows a cross section of the guide part formed by the first to third slot upper guide surfaces 91, 92, and 93.

As is clear from FIG. 12B, the slot thermal contacts 44 and the card thermal contacts 59 are brought into surface contact with each other on a flat plane orthogonal to the thickness direction. Further, the card medium 5 is pressed upward by the card pressing springs 90 from below. This causes the slot thermal contacts 44 and the card thermal contacts 59 to be brought into stable contact with each other. Further, as is clear from FIG. 12C, the slot electrical contacts 43 are elastically deformed to be brought into contact with the card electrical contacts 58.

In FIG. 12D, the slot-left-side guide portion 42b is separated from the card medium 5 in the third insertion state. The third card upper guide surface 83 is formed to recess downward from the first card upper guide surface 81. Further, in the third insertion state in which the slot thermal contacts 44 and the card thermal contacts 59 are brought into contact with each other, the first card upper guide surface 81 is separated from the first slot upper guide surface 91 in the thickness direction.

On the other hand, the first card upper guide surface 81 overlaps the first slot upper guide surface 91 in the thickness direction, and is brought into contact with the first slot upper guide surface 91 when removing the card medium 5. The first card upper guide surface 81 and the third card upper guide surface 83 are connected by the second card upper guide surface 82 which is a smooth surface. This makes it possible to smoothly remove the card medium 5. As described hereinabove, the third slot upper guide surface 93 is formed by the slot cover 45.

As described above, the structure described with reference to FIGS. 12A to 12D makes it possible to withstand repeated insertion and removal of the card medium 5 while ensuring positive contact for heat transfer.

As described above, in the second embodiment of the present invention as well, it is possible to prevent lowering of the reliability due to repeated insertion and removal of a card medium, and thereby improve thermal and electrical connection.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-081055 filed Apr. 14, 2016, which is hereby incorporated by reference herein in its entirety.

What is claimed is:

1. A card-type storage device comprising:
   a first thermal contact having a contact surface which intersects with a thickness direction of the card-type storage device;
   a first restriction portion that restricts a position of the card-type storage device in the thickness direction to a predetermined first position;
   a second restriction portion that restricts the position of the card-type storage device in the thickness direction to a predetermined second position which is different from the predetermined first position; and
   a third restriction portion that links the first restriction portion and the second restriction portion,
   wherein the card-type storage device is inserted into and removed from a slot device,
   wherein the first restriction portion is formed on a different position from both of the second restriction portion and the third restriction portion, in a first direction of inserting and removing the card-type storage device into and from the slot device, and
   wherein a length of the first restriction portion in the first direction is not larger than half the length of the card-type storage device in the first direction.

2. The card-type storage device according to claim 1, wherein each of the first restriction portion and the second restriction portion is a surface intersecting with the thickness direction.

3. The card-type storage device according to claim 1, wherein the first restriction portion is formed on a side portion of the card-type storage device such that the first restriction portion extends from an end face of the card-type storage device in the first direction.

4. The card-type storage device according to claim 1, wherein the card-type storage device is provided with a first electrical contact for supplying power to the card-type storage device, and
   wherein the first electrical contact and the first thermal contact are arranged at the same position in the thickness direction.

5. The card-type storage device according to claim 1, wherein the first direction intersects with the thickness direction,
   wherein the first restriction portion and the third restriction portion extend from a side portion of the card-type storage device to a direction which intersects with the thickness direction and the first direction, and
   wherein the second restriction portion is an escape portion formed in the direction which intersects with the thickness direction and the first direction.

6. The card-type storage device according to claim 1, wherein the card-type storage device is provided with a first electrical contact for supplying power to the card-type storage device and a second electrical contact for communicating with the slot device, and
   wherein the first electrical contact is positioned closer to the first thermal contact than the second electrical contact.

7. The card-type storage device according to claim 1, further comprising a plurality of first thermal contacts which are provided in a manner spaced from each other in a direction intersecting with the thickness direction of the card-type storage device and the first direction.

8. The card-type storage device according to claim 7, wherein the plurality of first thermal contacts are each formed of pure copper or copper alloy, and
   wherein a surface of each of the plurality of first thermal contacts is covered with a material having lower thermal conductivity and higher hardness than the pure copper or the copper alloy.

9. A slot device into which and from which a card-type storage device is inserted and removed, wherein the card-type storage device includes a first thermal contact having a contact surface which intersects with a thickness direction of the card-type storage device, a first restriction portion that restricts a position of the card-type storage device in the thickness direction to a predetermined first position, a second restriction portion that restricts the position of the card-type storage device in the thickness direction to a predetermined second position which is different from the predetermined first position, and a third restriction portion that links the first restriction portion and the second restriction portion,
   the slot device comprising:
   an urging portion that urges, when the card-type storage device is inserted, the card-type storage device in the thickness direction;
   a second thermal contact that has a contact surface intersecting with the thickness direction of the card-type storage device, and is brought into contact with the first thermal contact;
   a first guide portion that cooperates with the first restriction portion to restrict the position of the card-type storage device in the thickness direction to the predetermined first position;
   a second guide portion that cooperates with the first restriction portion to restrict the position of the card-type storage device in the thickness direction to the predetermined second position; and
   a third guide portion that links the first guide portion and the second guide portion.

10. The slot device according to claim 9, wherein the card-type storage device is provided with a first electrical contact for supplying power to the card-type storage device,
    wherein the first electrical contact and the first thermal contact are arranged at the same position in the thickness direction,
    wherein the slot device further comprises a second electrical contact that is brought into contact with the first electrical contact to supply power to the card-type storage device, wherein the second electrical contact has a spring property, and wherein the urging portion urges the card-type storage device in a direction opposite to a direction of a force generated when the second electrical contact is brought into contact with the first electrical contact.

11. The slot device according to claim 10, wherein an urging force applied by the urging portion is larger than a force applied by the second electrical contact.

12. The slot device according to claim 10, wherein in a state in which the card-type storage device is completely inserted into the slot device, the first to third restriction portions are separate from the first to third guide portions, respectively, and the first thermal contact and the second thermal contact are in contact with each other.

* * * * *